US012751331B2

(12) United States Patent
Lee et al.

(10) Patent No.: US 12,751,331 B2
(45) Date of Patent: Sep. 29, 2026

(54) SEMICONDUCTOR CHIP, SEMICONDUCTOR DEVICE, AND SEMICONDUCTOR PACKAGE INCLUDING THE SAME

(71) Applicant: Samsung Electronics Co., Ltd., Suwon-si (KR)

(72) Inventors: Eunsu Lee, Suwon-si (KR); Jongbo Shim, Suwon-si (KR); Sungeun Pyo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 387 days.

(21) Appl. No.: 18/370,283

(22) Filed: Sep. 19, 2023

(65) Prior Publication Data

US 2024/0096840 A1 Mar. 21, 2024

(30) Foreign Application Priority Data

Sep. 21, 2022 (KR) ........................ 10-2022-0119548

(51) Int. Cl.
*H01L 21/78* (2006.01)
*H10W 90/00* (2026.01)
(Continued)

(52) U.S. Cl.
CPC ............. *H10W 90/00* (2026.01); *H10B 80/00* (2023.02); *H10W 72/387* (2026.01);
(Continued)

(58) Field of Classification Search
CPC ......... H01L 24/32; H01L 24/08; H01L 24/16; H01L 24/73; H01L 25/0657;
(Continued)

(56) References Cited

U.S. PATENT DOCUMENTS 7,547,975 B2 * 6/2009 Takaya .................... H01L 24/82 257/E21.503
8,299,633 B2 * 10/2012 Su ....................... H01L 23/3737 257/E23.168

(Continued)

FOREIGN PATENT DOCUMENTS

KR 101162508 B1 7/2012
KR 1020210058165 A 5/2021
KR 1020210152243 A 12/2021

*Primary Examiner* — Vu A Vu
(74) *Attorney, Agent, or Firm* — Muir Patent Law, PLLC

(57) ABSTRACT

A semiconductor device includes a first semiconductor chip. The first semiconductor chip includes a first semiconductor substrate having a first surface and a second surface opposite to the first surface, and having a first active layer adjacent to the first surface, the first semiconductor substrate having a quadrangle shape from a plan view; a first through electrode penetrating at least a portion of the first semiconductor substrate and connected to the first active layer; a second chip connection pad on the second surface of the first semiconductor substrate and connected to the first through electrode; a first dummy pattern positioned outside the second chip connection pad on the second surface of the first semiconductor substrate from the plan view, the first dummy pattern comprising a line pattern extending horizontally along the second surface of the first semiconductor substrate; and a first chip connection pad on the first surface of the first semiconductor substrate and connected to the first through electrode. The first dummy pattern is disposed adjacent to at least one side of four sides of the quadrangle shape of the first semiconductor substrate from the plan view.

20 Claims, 23 Drawing Sheets

(51) Int. Cl.

| | |
|---|---|
| *H10B 80/00* | (2023.01) |
| *H10W 72/30* | (2026.01) |
| *H10W 74/15* | (2026.01) |
| *H10W 80/00* | (2026.01) |
| *H10W 90/20* | (2026.01) |

(52) U.S. Cl.

CPC .......... *H10W 74/15* (2026.01); *H10W 80/721* (2026.01); *H10W 90/297* (2026.01); *H10W 90/722* (2026.01); *H10W 90/732* (2026.01)

(58) Field of Classification Search

CPC ... H01L 2224/0801; H01L 2224/16145; H01L 2224/26145; H01L 2224/32145; H01L 2224/73204; H01L 2225/06513; H01L 2225/06541; H01L 2924/1434; H01L 24/06; H01L 24/14; H01L 24/17; H01L 25/50; H01L 2225/06517; H01L 2225/06565; H01L 24/05; H01L 24/13; H01L 24/83; H01L 23/3128; H01L 24/31; H01L 25/18; H01L 2225/06527; H01L 2225/06548; H10B 80/00

USPC .......................................................... 257/777

See application file for complete search history.

(56) References Cited

U.S. PATENT DOCUMENTS

| | | | | |
|---|---|---|---|---|
| 8,779,599 | B2 * | 7/2014 | Lin | H01L 25/50 257/725 |
| 9,224,697 | B1 * | 12/2015 | Kwon | H01L 25/0655 |
| 9,275,968 | B2 * | 3/2016 | Jeong | H01L 23/49811 |
| 9,299,736 | B2 * | 3/2016 | Chen | H10F 39/199 |
| 10,043,769 | B2 * | 8/2018 | Shih | H01L 24/02 |
| 10,461,036 | B2 | 10/2019 | Yu et al. | |
| 10,665,582 | B2 * | 5/2020 | Chen | H01L 24/89 |
| 10,818,640 | B1 * | 10/2020 | Yu | H01L 24/24 |
| 11,018,113 | B2 * | 5/2021 | Chuang | H01L 23/5385 |
| 11,145,639 | B2 * | 10/2021 | Cheng | H01L 23/5385 |
| 11,217,540 | B2 | 1/2022 | Kim | |
| 11,239,203 | B2 * | 2/2022 | Gaide | H01L 25/50 |
| 11,342,310 | B2 | 5/2022 | Choi et al. | |
| 11,508,707 | B2 * | 11/2022 | Su | H01L 23/562 |
| 11,855,003 | B2 * | 12/2023 | Wang | H01L 21/4853 |
| 11,901,333 | B2 * | 2/2024 | Li | H01L 21/78 |
| 2004/0212069 | A1 | 10/2004 | Chen et al. | |
| 2021/0143008 | A1 | 5/2021 | Ko et al. | |
| 2021/0151410 | A1 | 5/2021 | Hwang et al. | |

* cited by examiner

SEMICONDUCTOR CHIP, SEMICONDUCTOR DEVICE, AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2022-0119548, filed on Sep. 21, 2022, in the Korean Intellectual Property Office, the disclosure of which is incorporated by reference herein in its entirety.

BACKGROUND

The present disclosure relates to a semiconductor chip, a semiconductor device, and a semiconductor package including the same.

Semiconductor packages are becoming thinner and lighter at the same time as the storage capacity is increased. A semiconductor package may include semiconductor chips having various functions therein and may need to drive the semiconductor chips quickly. Accordingly, a stacked semiconductor package in which a plurality of semiconductor chips are stacked has been proposed as a semiconductor package.

An individual semiconductor chip included in a stacked semiconductor package benefits from having a structure capable of improving package reliability. In addition, in the operation of bonding a second semiconductor chip onto a first semiconductor chip of the stacked semiconductor package, it is important to easily adjust the adhesive between the first semiconductor chip and the second semiconductor chip.

SUMMARY

Aspects of the inventive concept provide a semiconductor chip capable of improving package reliability.

Aspects of the inventive concept also provide a semiconductor device including semiconductor chips capable of improving package reliability.

Aspects of the inventive concept also provide a semiconductor package including a semiconductor device capable of improving package reliability.

In some embodiments, a semiconductor device includes a first semiconductor chip. The first semiconductor chip includes a first semiconductor substrate having a first surface and a second surface opposite to the first surface, and having a first active layer adjacent to the first surface, the first semiconductor substrate having a quadrangle shape from a plan view; a first through electrode penetrating at least a portion of the first semiconductor substrate and connected to the first active layer; a second chip connection pad on the second surface of the first semiconductor substrate and connected to the first through electrode; a first dummy pattern positioned outside the second chip connection pad on the second surface of the first semiconductor substrate from the plan view, the first dummy pattern comprising a line pattern extending horizontally along the second surface of the first semiconductor substrate; and a first chip connection pad on the first surface of the first semiconductor substrate and connected to the first through electrode. The first dummy pattern is disposed adjacent to at least one side of four sides of the quadrangle shape of the first semiconductor substrate from the plan view.

In some embodiments, the semiconductor device may include a second semiconductor chip mounted on the first semiconductor chip; and a first adhesive layer disposed between the first semiconductor chip and the second semiconductor chip. The second semiconductor chip may comprise a second semiconductor substrate having a third surface and a fourth surface opposite to the first surface, and having a second active layer adjacent to the third surface, the second semiconductor substrate having a quadrangle shape from a plan view; a second through electrode penetrating at least a portion of the second semiconductor substrate and connected to the second active layer; a fourth chip connection pad on the fourth surface of the second semiconductor substrate and connected to the second through electrode; a second dummy pattern positioned outside the fourth chip connection pad on the fourth surface of the second semiconductor substrate from the plan view, the second dummy pattern comprising a line pattern extending horizontally along the fourth surface of the second semiconductor substrate; a third chip connection pad on the third surface of the second semiconductor substrate and connected to the second through electrode; and a first connection terminal attached to the third chip connection pad to connect the third chip connection pad to the second chip connection pad. The second dummy pattern is disposed adjacent to at least one side of four sides of the quadrangle of the second semiconductor substrate from the plan view, and the first adhesive layer surrounds the second chip connection pad, the third chip connection pad, the first connection terminal, and the first dummy pattern.

In some embodiments, the semiconductor device further includes a base chip, the first semiconductor chip being mounted on the base chip; a base adhesive layer disposed between the base chip and the first semiconductor chip; and an encapsulation layer surrounding the first semiconductor chip, the second semiconductor chip, the base adhesive layer, and the first adhesive layer on the base chip. The base chip may comprise a base substrate having a base lower surface and a base upper surface opposite the base lower surface, an external connection pad disposed on the base lower surface, an external connection terminal connected to the external connection pad, and an internal connection pad disposed on the upper surface of the base substrate. The first semiconductor chip may comprise a second connection terminal connected to the first chip connection pad and the internal connection pad, wherein the base adhesive layer surrounds the first chip connection pad and the second connection terminal, and the semiconductor device is a semiconductor package.

In some embodiments, a semiconductor device includes a first semiconductor chip, the first semiconductor chip comprising: a first semiconductor substrate having a first surface and a second surface opposite to the first surface, and having a first active layer adjacent to the first surface, the first semiconductor substrate having a quadrangle shape from a plan view; a plurality of first through electrodes penetrating at least a portion of the first semiconductor substrate and connected to the first active layer; a plurality of second chip connection pads on the second surface of the first semiconductor substrate and respectively connected to the plurality of first through electrodes; a plurality of protruding line patterns positioned outside the plurality of second chip connection pads on the second surface of the first semiconductor substrate from the plan view, each line pattern of the plurality of protruding line patterns extending horizontally along the second surface of the first semiconductor substrate; and a plurality of first chip connection pads on the first surface of the first semiconductor substrate and respectively connected to the plurality of first through electrodes. The plurality of protruding line patterns are disposed adjacent to respective sides of the quadrangle shape of the first semiconductor substrate from the plan view.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
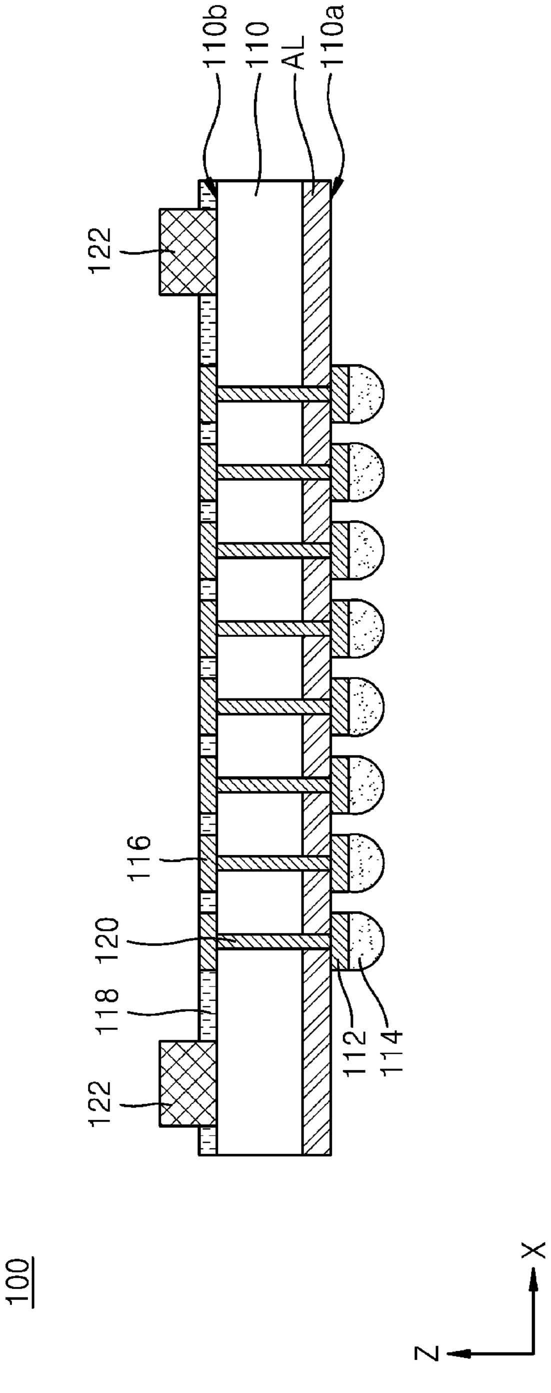
FIG. 1 is a cross-sectional view of a semiconductor chip according to an embodiment of the inventive concept.

Hereinafter, embodiments of the technical ideas of the inventive concept will be described in detail with reference to the accompanying drawings. The same reference numerals are used for the same components in the drawings, and duplicate descriptions thereof are omitted.

FIG. 1 is a cross-sectional view of a semiconductor chip according to an embodiment of the inventive concept.

Specifically, the semiconductor chip 100 may include a semiconductor substrate 110, a first chip connection pad 112, a first connection member 114, a second chip connection pad 116, a through electrode 120, and a dummy pattern 122. Various components are described in the singular herein, but are provided in plural.

In some embodiments, the semiconductor chip 100 may be a memory semiconductor chip or a non-memory semiconductor chip. The memory semiconductor chip may be, for example, a volatile memory semiconductor chip such as dynamic random access memory (DRAM) or static random access memory (SRAM), or may be a non-volatile memory semiconductor chip such as phase-change random access memory (PRAM), magnetoresistive random access memory (MRAM), ferroelectric random access memory (FeRAM), or resistive random access memory (RRAM). The semiconductor chip 100 may be described generally as a semiconductor device, which may also refer to a stack of semiconductor chips or a semiconductor package.

In some embodiments, the non-memory semiconductor chip may include a Central Processor Unit (CPU), a Micro Processor Unit (MPU), a Graphics Processor Unit (GPU), or an Application Processor (AP).

The semiconductor substrate 110 may have a first surface 110*a* and a second surface 110*b* opposite to the first surface 110*a*. For example, the first surface 110*a* may be a lower surface of the semiconductor substrate 110 and the second surface 110*b* may be an upper surface of the semiconductor substrate 110.

In some embodiments, the semiconductor substrate 110 may have an active layer AL adjacent to the first surface 110*a* of the semiconductor substrate 110. The active layer AL may include a plurality of individual devices of various types. The plurality of the individual devices may include various microelectronic devices, for example, complementary metal-oxide-semiconductor (CMOS) transistors, metal-oxide-semiconductor field effect transistors (MOSFETs), system large scale integration (LSI), image sensors such as CMOS imaging sensors (CISs), micro-electro-mechanical systems (MEMS), active devices, passive devices, and the like.

In some embodiments, the material of the semiconductor substrate 110 may include or may be silicon (Si). The semiconductor substrate 110 may include or may be a semiconductor element such as germanium (Ge) or a compound such as silicon carbide (SiC), gallium arsenide (GaAs), indium arsenide (InAs), and indium phosphide (InP). The material of the semiconductor substrate 110 is not limited to the above.

The through electrode 120 may penetrate at least a portion of the semiconductor substrate 110 in a vertical direction (Z direction) to be electrically connected to a plurality of individual devices in the active layer AL. The vertical direction (Z direction) may be a direction perpendicular to the direction (X direction) in which the first and second surfaces 110*a* and 110*b* of the semiconductor substrate 110 extend.

In some embodiments, the through electrode 120 may completely pass through the semiconductor substrate 110 in a vertical direction and be electrically connected to a plurality of individual devices in the active layer AL. When the through electrode 120 completely penetrates the semiconductor substrate 110 in the vertical direction, the through electrode 120 may be exposed on the first surface 110*a* and the second surface 110*b* of the semiconductor substrate 110.

Without being limited to the foregoing, the through electrode 120 may penetrate only a portion of the semiconductor substrate 110 in a vertical direction and be electrically connected to a plurality of individual devices in the active layer AL. When the through electrode 120 penetrates only a portion of the semiconductor substrate 110 in the vertical direction, although the through electrode 120 is not exposed on the first surface 110*a* of the semiconductor substrate 110, the through electrode 120 may be exposed on the second surface 110*b* of the semiconductor substrate 110.

In some embodiments, the through electrode 120 may have a pillar shape. The through electrode 120 may include a barrier film formed on the surface of the pillar and a buried conductive layer filling the inside of the barrier film. In some embodiments, the through electrode 120 may include or be formed of a conductive layer, such as a copper layer.

The first chip connection pad 112 may be disposed on the first surface 110*a* of the semiconductor substrate 110 to be connected to the through electrode 120. In some embodiments, the first chip connection pad 112 may be a pad for connecting a separate semiconductor chip or a package substrate when a separate semiconductor chip or package substrate is located under the semiconductor chip 100.

In some embodiments, the first chip connection pad 112 may be a chip pad. The first chip connection pad 112 may be a pad electrically connected to a plurality of individual devices in the active layer AL of the semiconductor substrate 110. The first chip connection pad 112 may have a flat upper and lower surface.

In some embodiments, the material of the first chip connection pad 112 may include or be formed of a metal such as Nickel (Ni), Copper (Cu), Gold (Au), Silver (Ag), Aluminum (Al), Tungsten (W), Titanium (Ti), Tantalum (Ta), Indium (In), Molybdenum (Mo), Manganese (Mn), Cobalt (Co), Tin (Sn), Magnesium (Mg), Rhenium (Re), Beryllium (Be), Gallium (Ga), Ruthenium (Ru), and the like, or an alloy thereof. However, the material of the first chip connection pad 112 is not limited to the above.

A connection member 114 may be disposed on the first chip connection pad 112. The connection member 114, also described as a connection terminal, may be a conductive material attached to the first chip connection pad 112. For example, the connection member 114 may be a solder ball or solder bump made of a conductive material for connecting the semiconductor chip 100 to a separate semiconductor chip, a package substrate, or an external device.

In some embodiments, the material of the connection member 114 may include or be formed of a metal such as Nickel (Ni), Copper (Cu), Gold (Au), Silver (Ag), Aluminum (Al), Tungsten (W), Titanium (Ti), Tantalum (Ta), Indium (In), Molybdenum (Mo), Manganese (Mn), Cobalt (Co), Tin (Sn), Magnesium (Mg), Rhenium (Re), Beryllium (Be), Gallium (Ga), Ruthenium (Ru), and the like, or an alloy thereof.

The second chip connection pad 116 may be disposed on the second surface 110*b* of the semiconductor substrate 110 to be connected to the through electrode 120. The second chip connection pad 116 may be formed using the same material as the first chip connection pad 112, and may also have a flat upper and lower surface. The second chip connection pad 116 may be a pad for connecting a separate semiconductor chip when a separate semiconductor chip is positioned on top of the semiconductor chip 100.

The dummy pattern 122 may be positioned on sides (e.g., opposite sides, or in some embodiments four sides) of the second chip connection pads 116 on the second surface 110*b* of the semiconductor substrate 110. As described below, the dummy pattern 122 may be disposed outside the second chip connection pads 116 from a plan view. As described below, the dummy pattern 122 may be a line pattern that is disposed in a line shape on the second surface 110*b* of the semiconductor substrate 110, when viewed from a plan view. The dummy pattern 122 may include, for example, material blocks formed on the second surface 110*b* of the semiconductor substrate 110. The dummy pattern 122 will be described in greater detail below.

The dummy pattern 122 and the second chip connection pads 116 may be insulated from one another by the passivation layer 118. In some embodiments, the passivation layer 118 may include or be formed of an insulating material such as an insulating polymer.

When a flowable adhesive, for example, a non-conductive film (NCF), is placed on the semiconductor chip 100 to attach a separate semiconductor chip on the semiconductor chip 100, the dummy pattern 122 may be an adhesive flow control pattern that controls the flow of the flowable adhesive when heat or pressure is applied. The dummy pattern 122 may be described as a dam structure, and may be described as including blocking bars, or blocking mounds.

In some embodiments, the height of the dummy pattern 122 may be greater than that of the second chip connection pad 116. In some embodiments, the dummy pattern 122 may have an integrated structure with the semiconductor substrate 110, and may for example, be formed of the same material as the semiconductor substrate 110 to be part of the semiconductor substrate. Alternatively, the dummy pattern 122 may be formed of a different material as the semiconductor substrate 110, such as, for example, an insulating material.

When attaching a separate semiconductor chip on the second surface 110*b* of the semiconductor substrate 110 using a flowable adhesive, the semiconductor chip 100 of the inventive concept may easily control the flow of the flowable adhesive due to the dummy pattern 122, thereby improving the reliability of the semiconductor device or semiconductor package.

Figure 2:
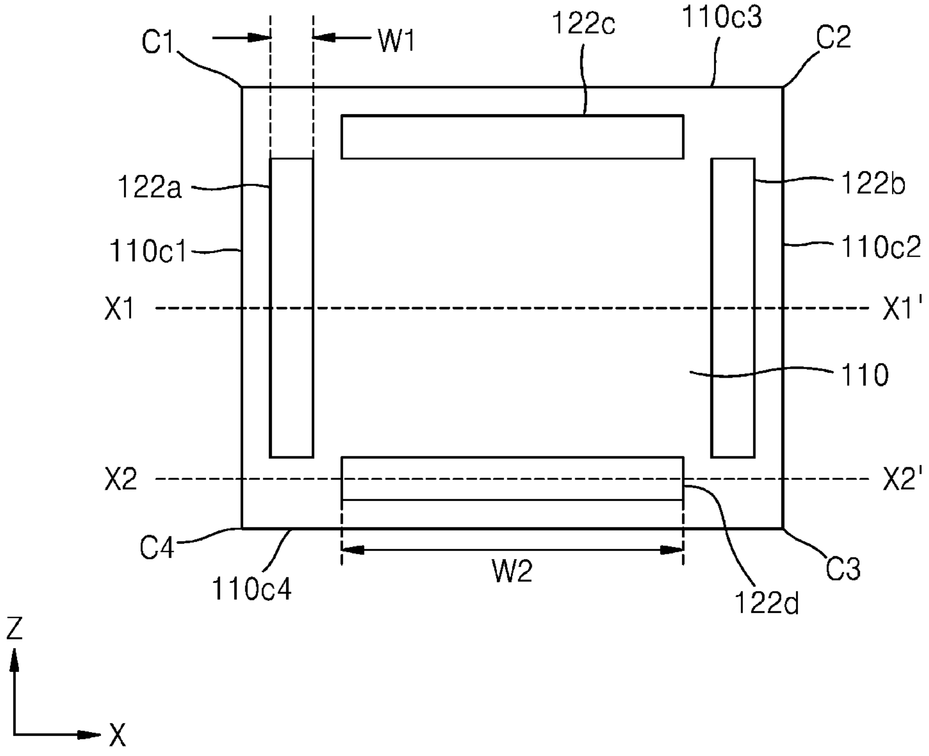
FIG. 2 is a plan view of a semiconductor chip according to an embodiment of the inventive concept.
Figure 3:
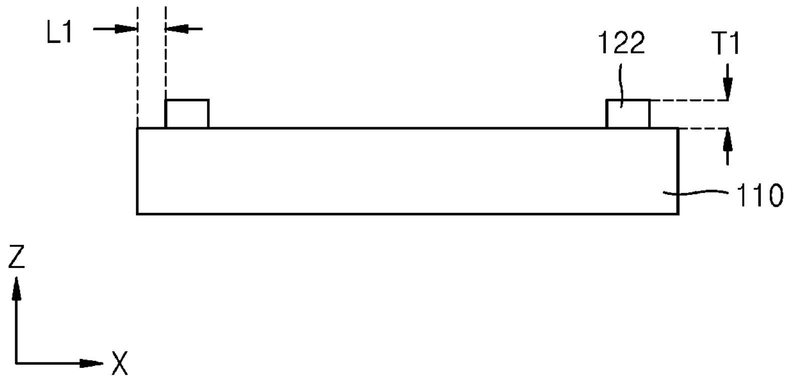
FIGS. 3 and 4 are cross-sectional views taken along lines X1-X1' and X2-X2' of the semiconductor chip of FIG. 2, respectively.
Figure 4:
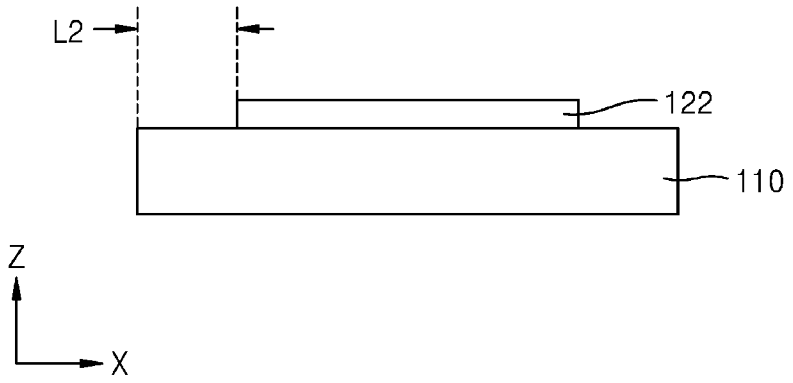

FIG. 2 is a plan view of a semiconductor chip according to an embodiment of the inventive concept, and FIGS. 3 and 4 are cross-sectional views of the semiconductor chip of FIG. 2 along lines X1-X1' and X2-X2', respectively.

Specifically, the X direction and the Y direction in FIGS. 2 to 4 may be directions parallel to the semiconductor substrate 110. The X direction and the Y direction may be directions in which the second surface 110*b* in FIG. 1 of the semiconductor substrate 110 extends. As described above, the Z direction may be a direction perpendicular to directions (X and Y directions) in which the second surface 110*b* of the semiconductor substrate 110 extends.

As shown in FIG. 2, the semiconductor chip 100 may have four sides 110*c*1, 110*c*2, 110*c*3, and 110*c*4. The four sides 110*c*1, 110*c*2, 110*c*3, and 110*c*4 may be referred to as first to fourth sides 110*c*1, 110*c*2, 110*c*3, and 110*c*4. The dummy pattern 122 may include a plurality of dummy patterns planarly disposed on the semiconductor substrate 110. The dummy pattern 122 may be planarly disposed outside the second chip connection pattern 116 in FIG. 1 disposed on the second surface 110*b* of the semiconductor substrate 110. For example, the dummy pattern 122 may be solid pieces of material formed in bar or line shapes on the same plane above the second surface 110*b* of the semiconductor substrate 110, which pieces may have flat surfaces connecting at angles, or curved, rounded surfaces.

The dummy pattern 122 may include a plurality of line patterns 122*a*, 122*b*, 122*c*, and 122*d* (e.g., bar or line structures, also described as dam protrusions, or dam structures), disposed adjacent to a quadrangle's four sides of 110*c*1, 110*c*2, 110*c*3, and 110*c*4 and spaced apart from each other, to each extend lengthwise in a horizontal direction along the second surface 110*b* of the semiconductor substrate 110 and along the respective adjacent side of the quadrangle shape of the semiconductor substrate 110. An item, layer, or portion of an item or layer described as extending "lengthwise" in a particular direction has a length in the particular direction and a width perpendicular to that direction, where the length is greater than the width. The line patterns 122*a*, 122*b*, 122*c*, and 122*d* may be disposed to not cover (e.g., not to block or serve as a dam for) regions adjacent to four corners C1, C2, C3, and C3 of the semiconductor substrate 110, which is rectangular, from a plan view. The line patterns 122*a*, 122*b*, 122*c*, and 122*d* may be referred to as first to fourth line patterns 122*a*, 122*b*, 122*c*, and 122*d*. The first line pattern 122*a* and the second line pattern 122*b* may face each other (e.g., be opposite each other) in the X direction and have symmetrical structures. The third line pattern 122*c* and the fourth line pattern 122*d* may face each other (e.g., be opposite each other) in the Y direction and have symmetrical structures.

In some embodiments, the dummy pattern 122 may include a line pattern disposed adjacent to at least one side of the quadrangle's four sides 110*c*1, 110*c*2, 110*c*3, and 110*c*4 of the semiconductor substrate 110 planarly unlike FIG. 2. For example, in some embodiments, the dummy pattern 122 may include only one of the line patterns 122*a*, 122*b*, 122*c*, and 122*d*.

In some embodiments, among the line patterns 122*a*, 122*b*, 122*c*, and 122*d*, for example, the first line pattern 122*a* may have a first width W1. The first width W1 may be several tens of micrometers (μm) or more, for example, about 20 μm to about 90 μm. Among the line patterns 122*a*, 122*b*, 122*c*, and 122*d*, for example, the fourth line pattern 122*d* may have a second width W2. The second width W2 may be several hundred micrometers (μm) or more, for example, about 100 μm to about 800 μm. The longer width (e.g., second width W2) may be described as a horizontal length, and the shorter width (e.g., first width W1) may be described as a horizontal width. The example dimensions of the different line patterns described herein may apply to any of the particular line patterns 122*a*, 122*b*, 122*c*, and 122*d*.

As shown in FIG. 3, among the line patterns 122*a*, 122*b*, 122*c*, and 122*d*, for example, the first line pattern 122*a* may be disposed apart from one edge of the semiconductor substrate 110 by a first distance L1. The first distance L1 may be one hundred micrometers (μm) or more, for example, about 100 μm to about 400 μm. The first distance L1 between an edge of the semiconductor substrate 110 and an adjacent edge or side of a corresponding line pattern may be greater than, and may be between 1.1 and 10 times the first width W1 of the line pattern. Among the line patterns 122*a*, 122*b*, 122*c*, and 122*d*, for example, the second line pattern 122*b* may have a first thickness T1 in the Z direction (e.g., a first vertical thickness). The first thickness T1 may be several tens of micrometers (μm), for example, about 10 μm to about 90 μm.

As shown in FIG. 4, among the line patterns 122*a*, 122*b*, 122*c*, and 122*d*, for example, the fourth line pattern 122*d* may be spaced apart from one edge of the semiconductor substrate 110 by a second distance L2. For example, an end surface of the fourth line pattern 112*d* may be spaced apart from one edge of the fourth line pattern 112*d* (e.g., in the X direction) by a second distance L2. The second distance L2 may be greater than the first distance L1, for example 2-5 times the first distance L1. The second distance L2 may be one hundred micrometers (μm) or more, for example, about 100 μm to about 400 μm. Each of the line patterns 122*a*, 122*b*, 122*c*, and 122*d* may have a vertical thickness that is between 2 and 10 times a vertical thickness of the second chip connection pads 116. A horizontal width of each line pattern 122*a*, 122*b*, 122*c*, or 122*d*, may be, for example, between 4 and 10 times the horizontal width of each second chip connection pad 116.

When attaching a separate semiconductor chip on the second surface 110*b* of the semiconductor substrate 110 using a flowable adhesive, due to the line patterns 122*a*, 122*b*, 122*c*, and 122*d* disposed on the second surface 110*b* in FIG. 1 of the semiconductor substrate 110, the reliability of semiconductor devices or semiconductor packages may be improved by easily controlling the flow of flowable adhesive.

Figure 5A:
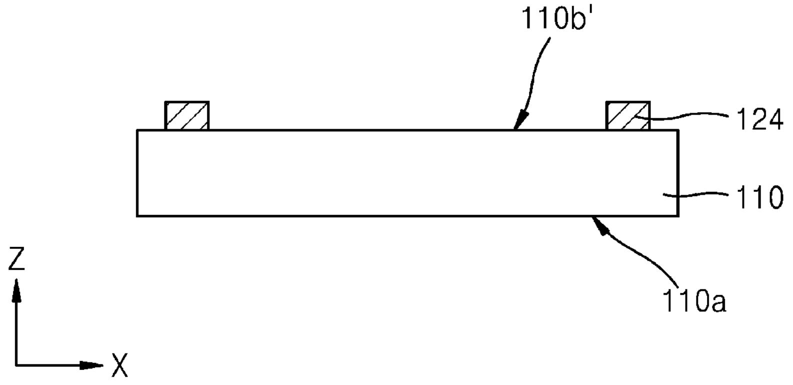
FIGS. 5A and 5B are cross-sectional views illustrating one embodiment of a method of manufacturing a dummy pattern of a semiconductor chip, according to the technical concept of the inventive concept.
Figure 5B:
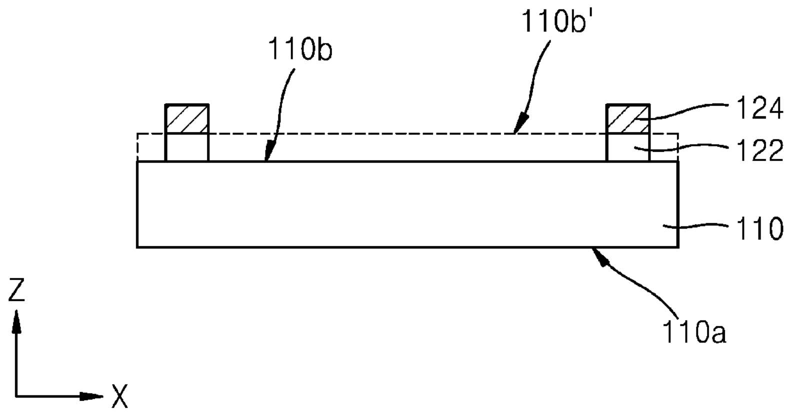

FIGS. 5A and 5B are cross-sectional views illustrating one embodiment of a method of manufacturing a dummy pattern of a semiconductor chip, according to the technical concept of the inventive concept.

Referring to FIG. 5A, a semiconductor substrate 110 having a first surface 110*a* and a second surface 110*b*' is prepared. Next, a mask pattern 124 is formed on the second surface 110*b*' of the semiconductor substrate 110. The mask pattern 124 may be formed of a photoresist pattern.

Referring to FIG. 5B, the second surface 110*b*' of the semiconductor substrate 110 is etched using the mask pattern 124 as an etching mask. The second surface 110*b*' of the semiconductor substrate 110 may be selectively etched to form a recessed second surface 110*b* of the semiconductor substrate 110. In addition, a dummy pattern 122 may be formed under the mask pattern 124. In this manner, the dummy pattern 122 may be formed from the substrate 110 as part of the substrate 110 (e.g., as a unitary integrated structure without any grain boundary therebetween). The dummy pattern 122 may be described as a protrusion, a protruding line pattern, or a protruding dam or dam structure.

As a result, after removing the mask pattern 124, the dummy pattern 122 may be formed on the second surface 110*b* of the semiconductor substrate 110. The dummy pattern 122 may be an etch pattern prepared by etching the second surface 110*b*' of the semiconductor substrate 110. The dummy pattern 122 may have the same body as the semiconductor substrate 110.

Figure 6A:
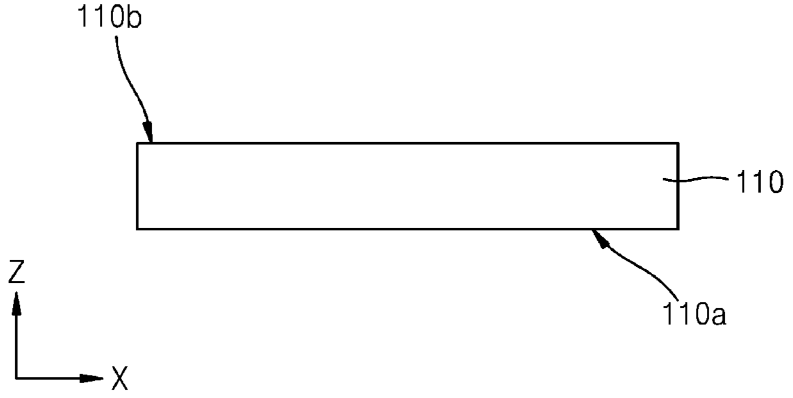
FIGS. 6A and 6B are cross-sectional views illustrating one embodiment of a method of manufacturing a dummy pattern of a semiconductor chip, according to the technical concept of the inventive concept.
Figure 6B:
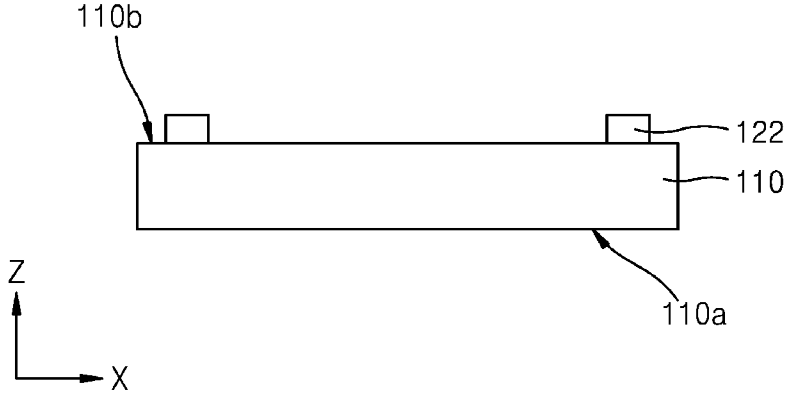

FIGS. 6A and 6B are cross-sectional views illustrating one embodiment of a method of manufacturing a dummy pattern of a semiconductor chip, according to the technical concept of the inventive concept.

Referring to FIG. 6A, a semiconductor substrate 110 having a first surface 110*a* and a second surface 110*b* is prepared.

Referring to FIG. 6B, a dummy pattern 122 may be directly formed on the second surface 110*b* of the semiconductor substrate 110. In some embodiments, the dummy pattern 122 may be directly attached to the semiconductor substrate 110. In some embodiments, the dummy pattern 122 may be attached using a carrier substrate and then the carrier substrate may be removed.

As a result, the dummy pattern 122 may be formed on the second surface 110*b* of the semiconductor substrate 110. The dummy pattern 122 may have a body that is different from that of the semiconductor substrate 110. For example, the dummy pattern 122 may be formed of the same or a different material than that of the semiconductor substrate 110, and may have a bottom surface that contacts a top surface (e.g., second surface 110*b*) of the semiconductor substrate 110.

Figure 7:
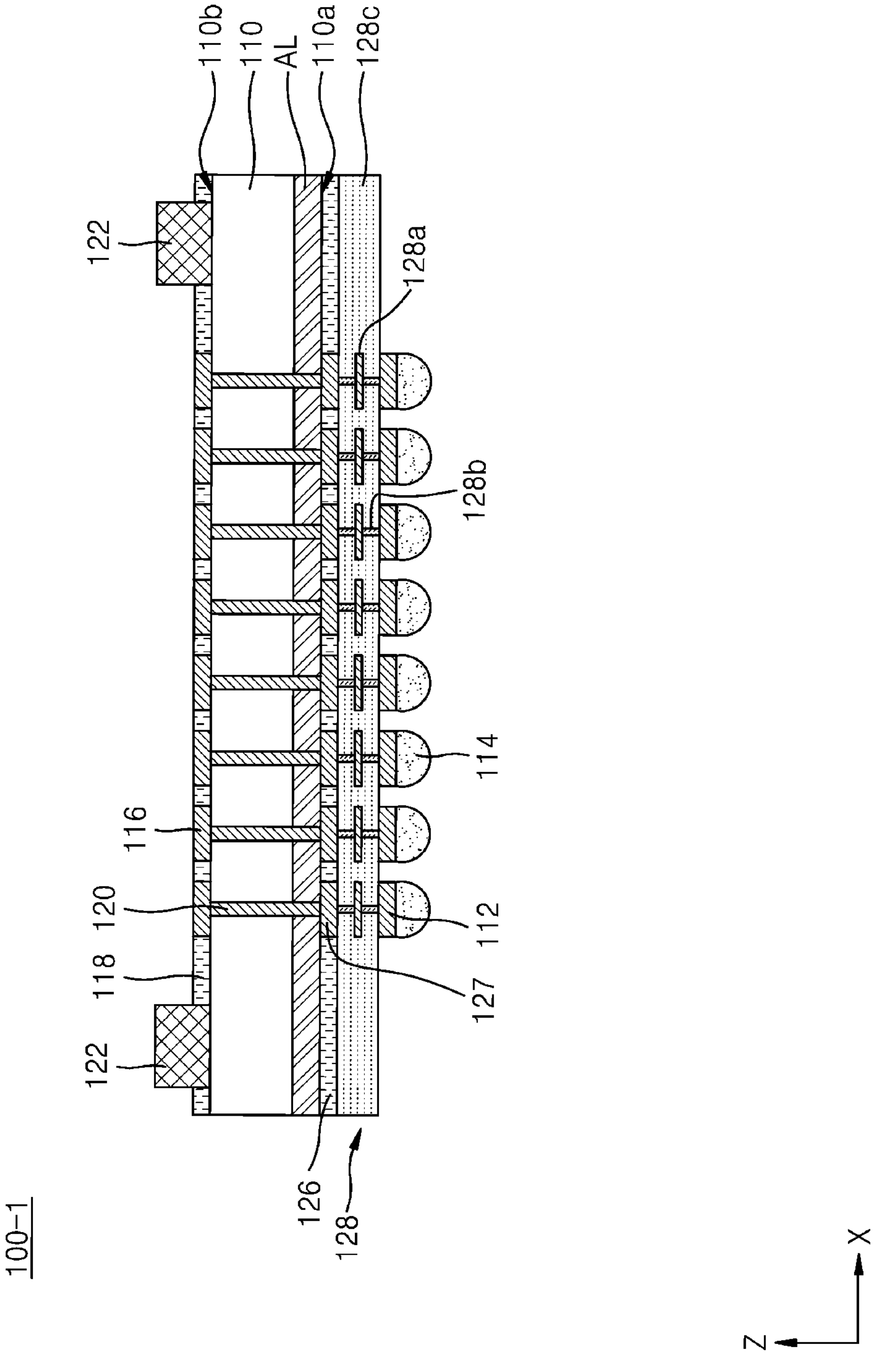
FIG. 7 is a cross-sectional view of a semiconductor chip according to an embodiment of the inventive concept.

FIG. 7 is a cross-sectional view of a semiconductor chip according to an embodiment of the inventive concept.

In detail, a semiconductor chip 100-1 may be the same as the semiconductor chip above except that the chip pad 127 and the redistribution structure 128 electrically connected to the chip pad 127 are further formed when compared to the semiconductor chip 100 of FIG. 1. In FIG. 7, the same descriptions as given with reference to FIG. 1 are briefly given or omitted.

The semiconductor chip 100-1 may include a semiconductor substrate 110, a first chip connection pad 112, a first connection member 114, a second chip connection pad 116, a through electrode 120, a dummy pattern 122, a chip pad 127, and a redistribution structure 128.

The chip pad 127 may be formed on the first surface 110*a* of the semiconductor substrate 110. The chip pad 127 may be a pad electrically connected to a plurality of individual devices in the active layer AL of the semiconductor substrate 110. The chip pad 127 may be insulated from a plurality of individual devices by a passivation layer 126.

A redistribution structure 128 may be formed under the passivation layer 126 and the chip pad 127. The redistribution structure 128 may include a redistribution layer 128*a* (also described as a redistribution wiring layer 118*a*), a redistribution via layer 128*b*, and a redistribution insulating layer 128*c*. The chip pad 127 may be electrically connected to the redistribution via layer 128*b* of the redistribution structure 128. The redistribution via layer 128*b* of the redistribution structure 128 may be electrically connected to the first chip connection pad 112 and the connection member 114.

Figure 8:
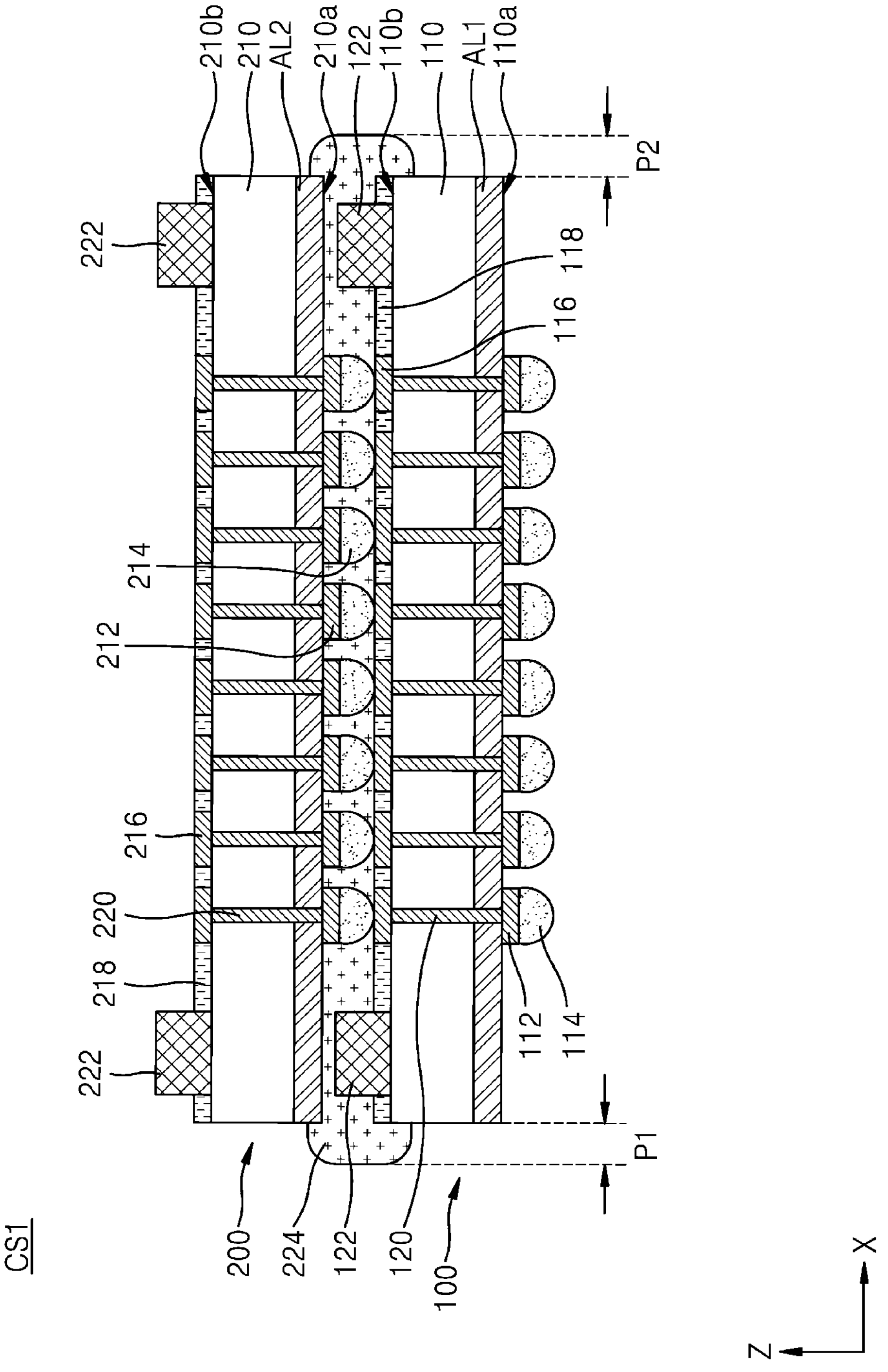
FIG. 8 is a cross-sectional view of a semiconductor device including semiconductor chips according to an embodiment of the inventive concept.

FIG. 8 is a cross-sectional view of a semiconductor device including semiconductor chips according to an embodiment of the inventive concept.

Specifically, a semiconductor device CS1 may include a first semiconductor chip 100, a second semiconductor chip 200 mounted on the first semiconductor chip 100, and a first adhesive layer 224 disposed between the first semiconductor chip 100 and the second semiconductor chip 200.

The first semiconductor chip 100 may be the same as the semiconductor chip 100 described above with reference to FIGS. 1 to 6. Since the first semiconductor chip 100 has been described above, descriptions thereof are briefly given or omitted. The second semiconductor chip 200 may have substantially the same configuration as the first semiconductor chip 100. The second semiconductor chip 200 may have the same configuration as that of the first semiconductor chip 100.

The first semiconductor chip 100 has a first surface 110*a* and a second surface 110*b* opposite to the first surface 110*a*, and may include a first semiconductor substrate 110 having a first active layer AL1 adjacent to the first surface 110*a*, and a first through electrode 120 penetrating at least a portion of the first semiconductor substrate 110 and connected to the first active layer AL1.

The first semiconductor chip 100 may include a second chip connection pad 116 on the second surface 110*b* of the first semiconductor substrate 110 to be connected to the first through electrode 120, and a first dummy pattern 122 positioned outside the second chip connection pad 116 planarly (e.g., from a plan view) on the second surface 110*b* of the first semiconductor substrate 110. The first dummy pattern 122 and the second chip connection pad 116 may be insulated from a plurality of elements by the first passivation layer 118.

The first semiconductor chip 100 may include a first chip connection pad 112 on the first surface 110*a* of the first semiconductor substrate 110 to be connected to the first through electrode 120. A first connection member 114 may be attached to the first chip connection pad 112. As described above, the first dummy pattern 122 may include a first line pattern disposed adjacent to at least one side of the four sides of a quadrangle of the first semiconductor substrate 110 planarly.

In some embodiments, the first dummy pattern 122 includes a plurality of first dummy patterns formed on the same plane, and the first dummy patterns may be a plurality of first line patterns disposed apart from each other and adjacent to the four sides of a quadrangle of the first semiconductor substrate 110 from a plan view.

In some embodiments, the height of the first dummy pattern 122 (e.g., above a top surface of the semiconductor substrate 110) may be greater than that of the second chip connection pad 116. The first dummy pattern 122 may have an integrated structure with the first semiconductor substrate 110.

The second semiconductor chip 200 has a third surface 210*a* and a fourth surface 210*b* opposite to the third surface 210*a*, and may include a second semiconductor substrate 210 having a second active layer AL2 adjacent to the third surface 210*a*, and a second through electrode 220 penetrating at least a portion of the second semiconductor substrate 210 and connected to the second active layer AL2. The second semiconductor substrate 210 and the second through electrode 220 may have structures corresponding to the first semiconductor substrate 110 and the first through electrode 120, respectively. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The second semiconductor chip 200 may include a fourth chip connection pad 216 on the fourth surface 210*b* of the second semiconductor substrate 210 to be connected to the second through electrode 220, and a second dummy pattern 222 positioned outside the fourth chip connection pads 216 planarly on the fourth surface 210*b* of the second semiconductor substrate 210. The fourth chip connection pad 216 and the second dummy pattern 222 may have structures corresponding to the second chip connection pad 116 and the first dummy pattern 122, respectively. The second dummy pattern 222 and the fourth chip connection pad 216 may be insulated from a plurality of elements by the second passivation layer 218.

The second semiconductor chip 200 may include a third chip connection pad 212 on the third surface 210*a* of the second semiconductor substrate 210 to be connected to the second through electrode 220, and a second connection member 214 attached to the third chip connection pad 212 and connecting the third chip connection pad 212 to the second chip connection pad 116. The third chip connection pad 212 and the second connection member 214 may have structures corresponding to the first chip connection pad 112 and the first connection member 114, respectively.

The second dummy pattern 222 may include a second line pattern disposed adjacent to at least one side of the four sides of a quadrangle of the second semiconductor substrate 210 from a plan view. The second dummy pattern 222 may have a configuration corresponding to the first dummy pattern 122.

In some embodiments, the second dummy pattern 222 includes a plurality of second dummy patterns disposed on the same plane, and the second dummy patterns may be a plurality of second line patterns disposed apart from each other and adjacent to the four sides of a quadrangle of the second semiconductor substrate 210 from a plan view.

In some embodiments, a height of the second dummy pattern 222 may be greater than a height of the fourth chip connection pad 216. The second dummy pattern 222 may have an integrated structure with the second semiconductor substrate 210.

The first adhesive layer 224 may be configured to surround the second chip connection pads 116, the third chip connection pads 212, the second connection members 214, and the first dummy pattern 122. In one embodiment, the first adhesive layer 224 may surround and contact side surfaces and a top surface of the first dummy pattern 122. The first adhesive layer 224 may protrude from edges of the first semiconductor substrate 110 and the second semiconductor substrate 210 (e.g., from opposite edges of each substrate, or from all four edges of each substrate).

In some embodiments, the first adhesive layer 224 may include a material having fluidity that is changed by heat. The first adhesive layer 224 may be a film or tape itself having adhesive properties. The first adhesive layer 224 may include a material having fluidity that increases when the material receives heat and reduces fluidity when releasing heat. In some embodiments, the first adhesive layer 224 may be a non-conductive film (NCF). The first adhesive layer 224 may be a film made of an insulating polymer.

The first adhesive layer 224 may protrude from one side surface and the other (e.g., an opposite) side surface of the first semiconductor substrate 110 and the second semiconductor substrate 210 to a first protrusion length P1 and a second protrusion length P2, respectively. In some embodiments, the first protrusion length P1 and the second protrusion length P2 may be the same as or different from each other. The first adhesive layer 224 may contact adjacent, facing surfaces of the first semiconductor substrate 110 and the second semiconductor substrate 210, as well as opposite side surfaces of the first semiconductor substrate 110 and the second semiconductor substrate 210. The first adhesive layer 224 may easily adhere the first semiconductor chip 100 to the second semiconductor chip 200.

In the semiconductor device CS1 as described above, the second semiconductor chip 200 may be attached to the second surface 110*b* of the first semiconductor substrate 110 using the first adhesive layer 224 made of flowable adhesive. The semiconductor device CS1 may easily control the flow of the first adhesive layer 224 due to the first dummy patterns 122, that is, line patterns disposed on the second surface 110*b* of the first semiconductor substrate 110. The semiconductor device CS1 may improve reliability by easily bonding the first semiconductor chip 100 to the second semiconductor chip 200 with the first adhesive layer 224.

Figure 9:
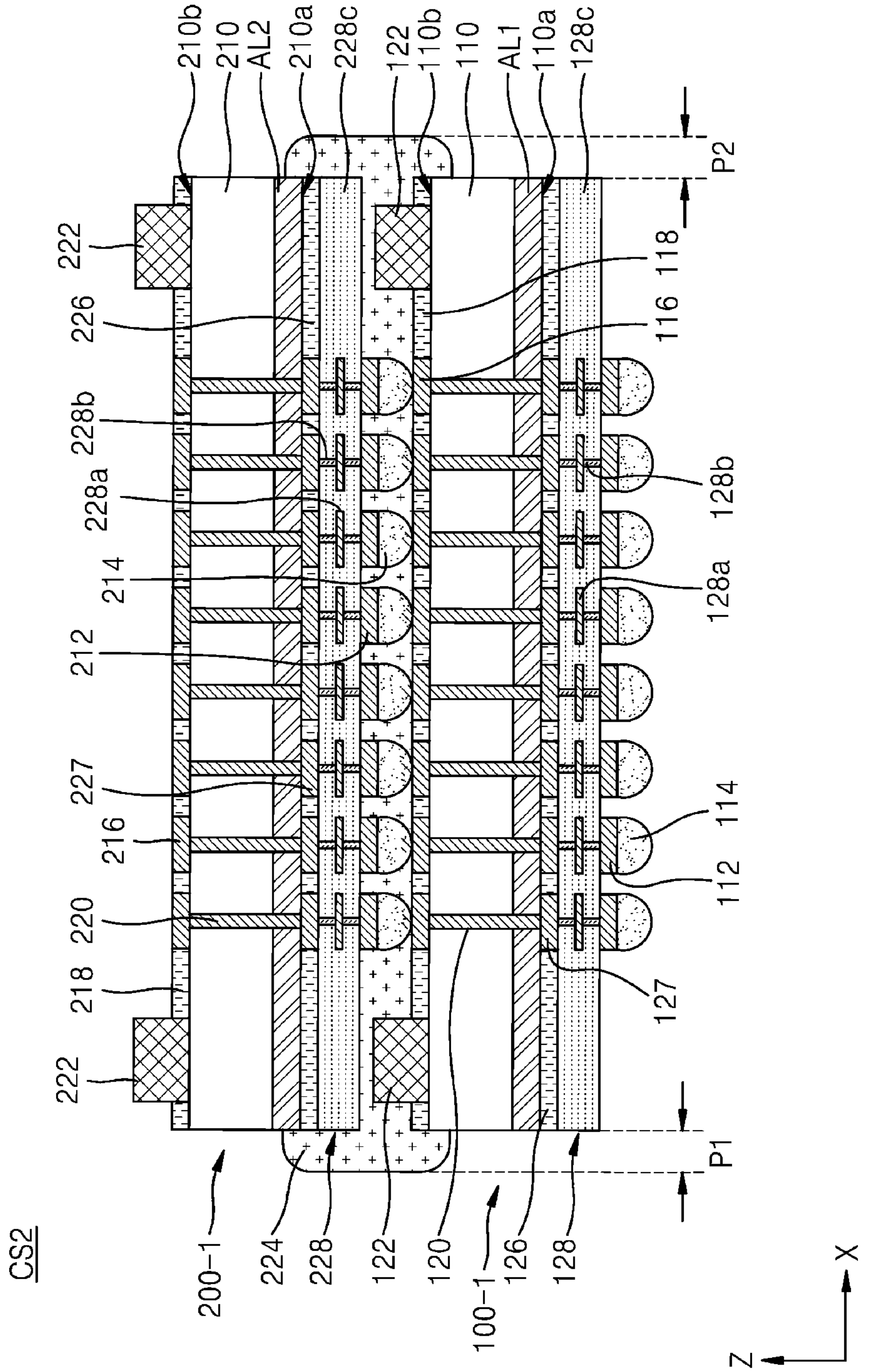
FIG. 9 is a cross-sectional view of a semiconductor device including semiconductor chips according to an embodiment of the inventive concept.

FIG. 9 is a cross-sectional view of a semiconductor device including semiconductor chips according to an embodiment of the inventive concept.

Specifically, when compared to the semiconductor device CS1 of FIG. 8, a semiconductor device CS2 is the same as the semiconductor device above except that the first semiconductor chip 100-1 and the second semiconductor chip 200-1 further include a first redistribution structure 128 and a second redistribution structure 228, respectively. In FIG. 9, the same descriptions as those given with reference to FIGS. 7 and 8 are briefly given or omitted.

The semiconductor device CS2 may include a first semiconductor chip 100-1, a second semiconductor chip 200-1 mounted on the first semiconductor chip 100-1, and a first adhesive layer 224 disposed between the first semiconductor chip 100-1 and the second semiconductor chip 200-1.

The first semiconductor chip 100-1 may be the same as the semiconductor chip described above with reference to FIG. 7. Since the first semiconductor chip 100-1 has been described above, descriptions thereof are briefly given or omitted. The second semiconductor chip 200-1 may have substantially the same configuration as the first semiconductor chip 100-1. The second semiconductor chip 200-1 may have the same configuration as that of the first semiconductor chip 100-1.

The first semiconductor chip 100-1 may include a first semiconductor substrate 110, a first chip connection pad 112, a first connection member 114, a second chip connection pad 116, a first through electrode 120, a first dummy pattern 122, a first chip pad 127, and a first redistribution structure 128. The first chip pad 127 may be formed on the first surface 110*a* of the first semiconductor substrate 110. The first chip pad 127 may be a pad electrically connected to a plurality of individual devices in the first active layer AL of the first semiconductor substrate 110. The first chip pad 127 may be insulated by the first passivation layer 126.

The first redistribution structure 128 may be formed under the first passivation layer 126 and the first chip pad 127. The first redistribution structure 128 may include a first redistribution layer 128*a*, a first redistribution via layer 128*b*, and a first redistribution insulating layer 128*c*. The first chip pad 127 may be electrically connected to the first redistribution via layer 128*b* of the first redistribution structure 128. The first redistribution via layer 128*b* of the first redistribution structure 128 may be electrically connected to the first chip connection pad 112 and the first connection member 114.

As described above, the first dummy pattern 122 may include a first line pattern disposed adjacent to at least one side of the four sides of a quadrangle of the first semiconductor substrate 110 planarly. In some embodiments, the height of the first dummy pattern 122 may be greater than that of the second chip connection pad 116. The first dummy pattern 122 may have an integrated structure with the first semiconductor substrate 110.

The second semiconductor chip 200-1 may include a second semiconductor substrate 210, a third chip connection pad 212, a second connection member 214, a fourth chip connection pad 216, and a second through electrode 220, a second dummy pattern 222, a second chip pad 227, and a second redistribution structure 228.

The second chip pad 227 may be formed on the third surface 210*a* of the second semiconductor substrate 210. The second chip pad 227 may be a pad electrically connected to a plurality of individual devices in the second active layer AL2 of the second semiconductor substrate 210.

The second chip pad 227 may be insulated from a plurality of elements by the second passivation layer 226.

A second redistribution structure 228 may be formed under the second passivation layer 226 and the second chip pad 227. The second redistribution structure 228 may include a second redistribution layer 228*a*, a second redistribution via layer 228*b*, and a second redistribution insulating layer 228*c*. The second chip pad 227 may be electrically connected to the second redistribution via layer 228*b* of the second redistribution structure 228. The second redistribution via layer 228*b* of the second redistribution structure 228 may be electrically connected to the third chip connection pad 212 and the second connection member 214. The second connection member 214 may be connected to the second chip connection pad 116.

As described above, the second dummy pattern 222 may include a second line pattern disposed adjacent to at least one side of the four sides of a quadrangle of the second semiconductor substrate 210 planarly. In some embodiments, a height of the second dummy pattern 222 may be greater than a height of the fourth chip connection pad 216. The second dummy pattern 222 may have an integrated structure with the second semiconductor substrate 210.

The first adhesive layer 224 may be configured to surround the second chip connection pad 116, the third chip connection pad 212, the second connection member 214, and the first dummy pattern 122. In one embodiment, the first adhesive layer 224 may surround and contact side surfaces and a top surface of the first dummy pattern 122. The first adhesive layer 224 may protrude from opposite ends (e.g., opposite edges or side surfaces) of the first semiconductor substrate 110 and the second semiconductor substrate 210.

The first adhesive layer 224 may protrude from one end and an opposite end of the first semiconductor substrate 110-1 and the second semiconductor substrate 210-1 to a first protrusion length P1 and a second protrusion length P2, respectively. In some embodiments, the first protrusion length P1 and the second protrusion length P2 may be the same as or different from each other. The first adhesive layer 224 may contact adjacent facing surfaces of the first semiconductor substrate 110-1 and the second semiconductor substrate 210-1, as well as opposite side surfaces of the first semiconductor substrate 110-1 and the second semiconductor substrate 210-1. The first adhesive layer 224 may easily adhere the first semiconductor chip 100-1 to the second semiconductor chip 200-1.

In the semiconductor device CS2 described above, the flow of the first adhesive layer 224 may be easily controlled due to the first dummy patterns 122, for example, line patterns disposed on the second surface 110*b* of the first semiconductor substrate 110. The semiconductor device CS2 may improve reliability by easily bonding the first semiconductor chip 100-1 to the second semiconductor chip 200-1 with the first adhesive layer 224. In addition, the semiconductor device CS2 may easily connect the first semiconductor chip 100-1 to the second semiconductor chip 200-1 by using the first redistribution structure 128 and the second redistribution structure 228.

Figure 10:
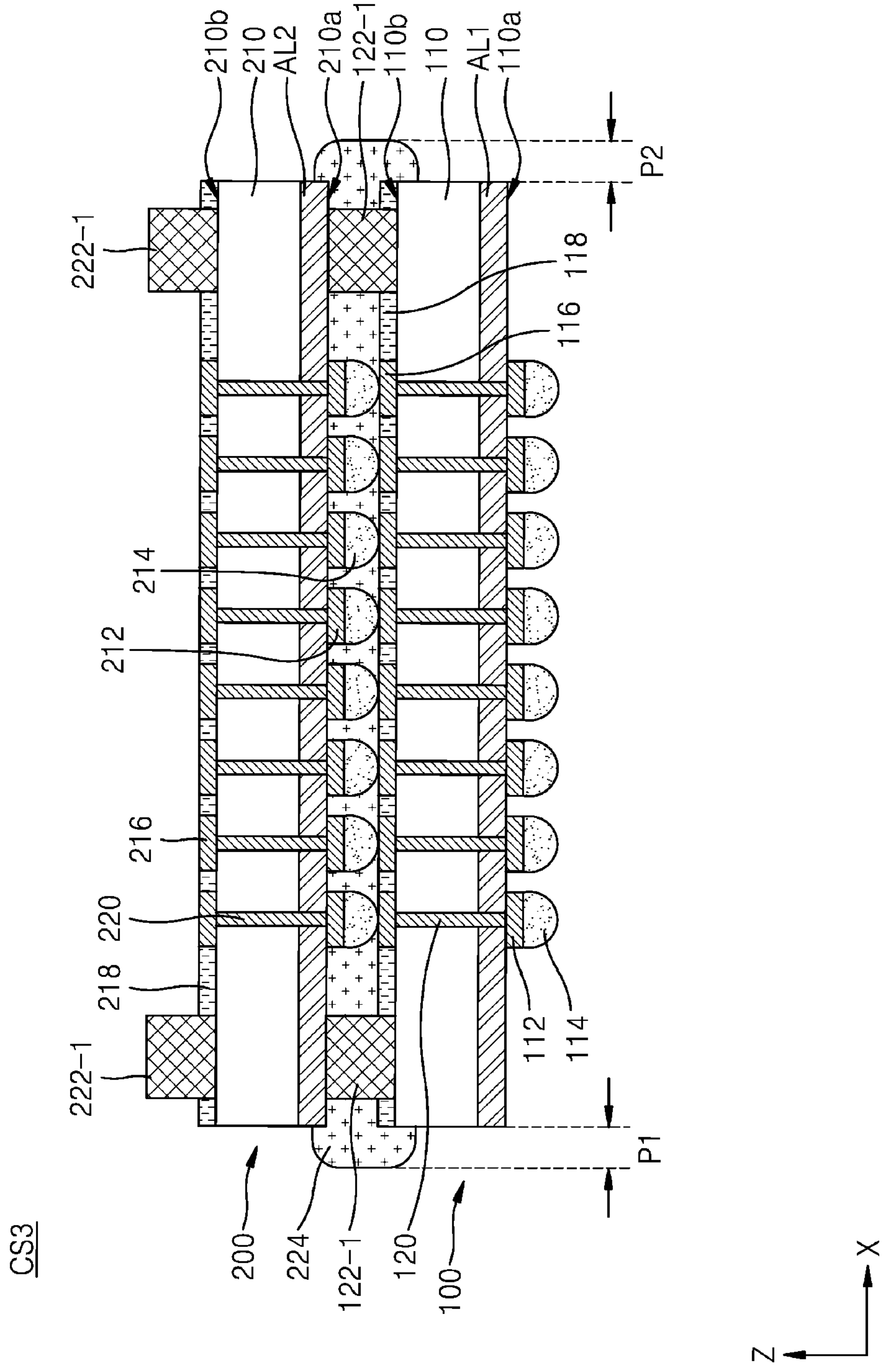
FIG. 10 is a cross-sectional view of a semiconductor device including semiconductor chips according to an embodiment of the inventive concept.

FIG. 10 is a cross-sectional view of a semiconductor device including semiconductor chips according to an embodiment of the inventive concept.

Specifically, the semiconductor device CS3 may be the same as the semiconductor device CS1 of FIG. 8 except for the height of the first dummy pattern 122-1 being different. In FIG. 10, the same descriptions as given with reference to FIG. 8 are briefly given or omitted.

The semiconductor device CS3 may include a first semiconductor chip 100, a second semiconductor chip 200 mounted on the first semiconductor chip 100, and a first adhesive layer 224 disposed between the first semiconductor chip 100 and the second semiconductor chip 200.

The first semiconductor chip 100 may include a first semiconductor substrate 110, a first chip connection pad 112, a first connection member 114, a second chip connection pad 116, a first through electrode 120, and a first dummy pattern 122-1.

As described above, the first dummy pattern 122-1 may include a first line pattern disposed adjacent to at least one side of the four sides of a quadrangle of the first semiconductor substrate 110 from a plan view.

The second semiconductor chip 200 may include a second semiconductor substrate 210, a third chip connection pad 212, a second connection member 214, a fourth chip connection pad 216, a second through electrode 220, and a second dummy pattern 222-1.

As described above, the second dummy pattern 222-1 may include a second line pattern disposed adjacent to at least one side of the four sides of a quadrangle of the second semiconductor substrate 210 from a plan view.

In the semiconductor device CS3, the first dummy pattern 122-1 may contact the third surface 210*a* of the second semiconductor substrate 210. The first dummy pattern 122-1 may contact both the second surface 110*b* of the first semiconductor substrate 110 and the third surface 210*a* of the second semiconductor substrate 210.

The first adhesive layer 224 may be configured to surround the second chip connection pad 116, the third chip connection pad 212, the second connection member 214, and the first dummy pattern 122-1. The first adhesive layer 224 may protrude from both ends (e.g., opposite sides) of the first semiconductor substrate 110 and the second semiconductor substrate 210. The first adhesive layer 224 may protrude from one end and an opposite end of the first semiconductor substrate 110 and the second semiconductor substrate 210 to a first protrusion length P1 and a second protrusion length P2, respectively. The first adhesive layer 224 may contact adjacent facing surfaces of the first semiconductor substrate 110 and the second semiconductor substrate 210, as well as opposite side surfaces of the first semiconductor substrate 110 and the second semiconductor substrate 210. The first adhesive layer 224 may cover side surfaces of the first dummy pattern 122-1 without contacting a top surface of the first dummy pattern 122-1. The top surface of the first dummy pattern 122-1 may contact a bottom surface of the second semiconductor chip 200. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

The semiconductor device CS3 as described above may easily support the first semiconductor chip 100 and the second semiconductor chip 200 due to the first dummy pattern 122-1, and may easily adhere the first semiconductor chip 100 to the second semiconductor chip 200 using the first adhesive layer 224.

Figure 11:
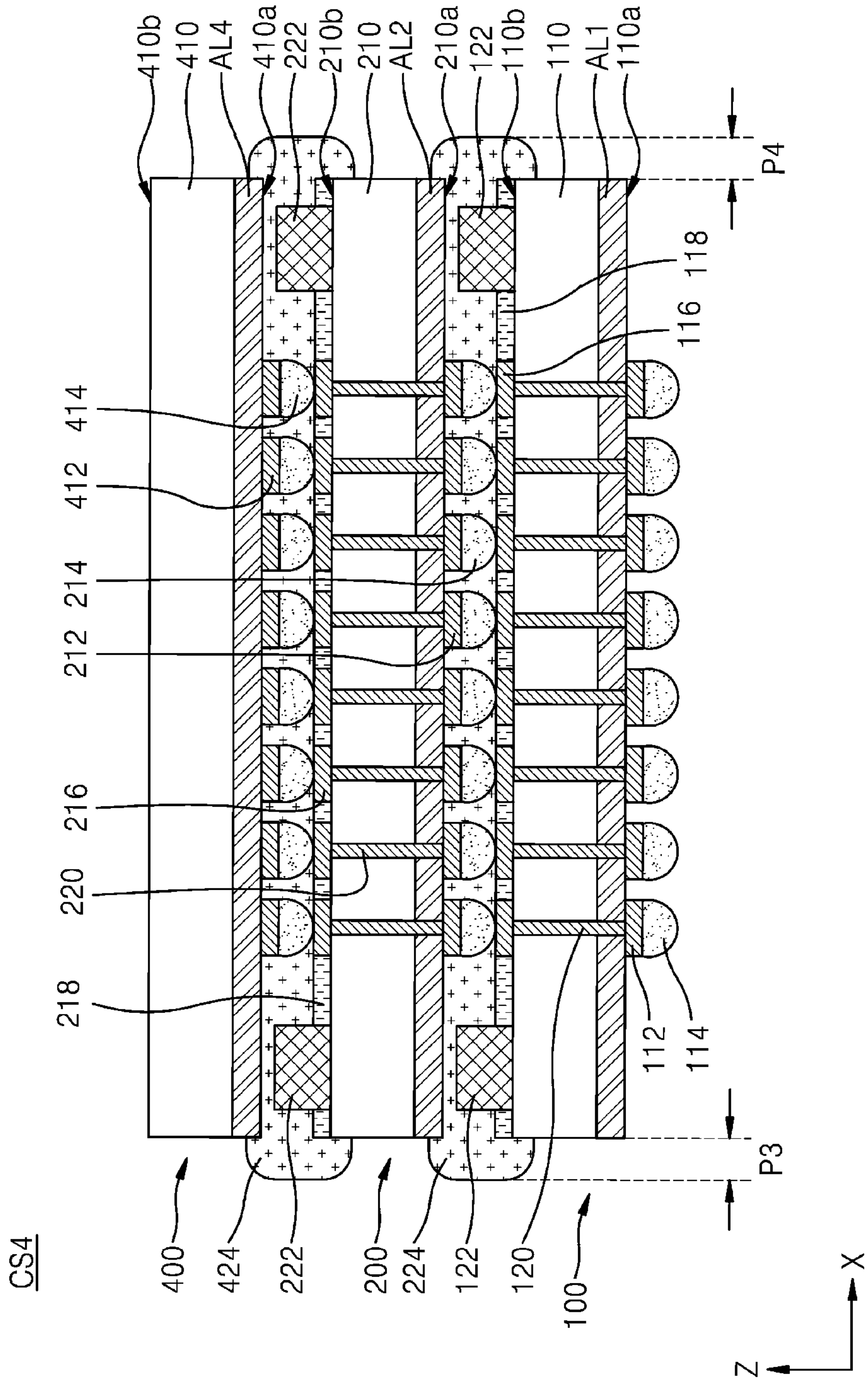
FIG. 11 is a cross-sectional view of a semiconductor device including semiconductor chips according to an embodiment of the inventive concept.

FIG. 11 is a cross-sectional view of a semiconductor device including semiconductor chips according to an embodiment of the inventive concept.

Specifically, a semiconductor device CS4 may be the same as the semiconductor device CS1 of FIG. 8 except that a fourth semiconductor chip 400 is further stacked on the second semiconductor chip 200. In FIG. 11, the same descriptions as given with reference to FIG. 8 are briefly given or omitted.

The semiconductor device CS4 may include a first semiconductor chip 100, a second semiconductor chip 200 mounted on the first semiconductor chip 100, the fourth semiconductor chip 400 mounted on the second semiconductor chip 200, a first adhesive layer 224 disposed between a first semiconductor chip 100 and a second semiconductor chip 200, and a third adhesive layer 424 disposed between the second semiconductor chip 200 and the fourth semiconductor chip 400.

The fourth semiconductor chip 400 may be a semiconductor chip positioned on top of the semiconductor device CS4. Since the fourth semiconductor chip 400 is an uppermost semiconductor chip, a through electrode may not be formed therein. Accordingly, in this embodiment, for convenience of subsequent description, the term "third semiconductor chip" is not used.

The first semiconductor chip 100 may include a first semiconductor substrate 110, a first chip connection pad 112, a first connection member 114, a second chip connection pad 116, a first through electrode 120, and a first dummy pattern 122.

The second semiconductor chip 200 may include a second semiconductor substrate 210, a third chip connection pad 212, a second connection member 214, a fourth chip connection pad 216, a second through electrode 220, and a second dummy pattern 222.

The first adhesive layer 224 may be positioned between the first semiconductor chip 100 and the second semiconductor chip 200. The first adhesive layer 224 may be configured to surround the second chip connection pad 116, the third chip connection pad 212, the second connection member 214, and the first dummy pattern 122. The first adhesive layer 224 may easily attach the first semiconductor chip 100 and the second semiconductor chip 200 due to the first dummy pattern 122.

The fourth semiconductor chip 400 may include a fourth semiconductor substrate 410, a seventh chip connection pad 412, and a fourth connection member 414. The fourth semiconductor chip 400 has a seventh surface 410*a* and an eighth surface 410*b* opposite to the seventh surface 410*a*, and may include a fourth semiconductor substrate 410 having a fourth active layer AL4 adjacent to the seventh surface 410*a*. In the fourth semiconductor chip 400, a seventh chip connection pad 412 and a fourth connection member 414 may be disposed on the seventh surface 410*a* of the fourth semiconductor substrate 410 to be connected to the fourth chip connection pad 216.

The third adhesive layer 424 may be positioned between the second semiconductor chip 200 and the fourth semiconductor chip 400. The third adhesive layer 424 may be configured to surround the fourth chip connection pad 216, the seventh chip connection pad 412, the fourth connection member 414, and the second dummy pattern 222.

The third adhesive layer 424 may protrude from one end and a second opposite end of the second semiconductor substrate 210 and the fourth semiconductor substrate 410 to a third protrusion length P3 and a second protrusion length P4, respectively. In some embodiments, the fourth protrusion length P3 and the second protrusion length P4 may be the same as or different from each other. The fourth protrusion length P3 and the second protrusion length P4 may be the same as or different from the first protrusion length P1 and the second protrusion length P2.

The third adhesive layer 424 may contact adjacent facing surfaces of the second semiconductor substrate 210 and the fourth semiconductor substrate 410, as well as opposite side surfaces of the second semiconductor substrate 210 and the fourth semiconductor substrate 410. The third adhesive layer 424 may easily attach the second semiconductor chip 200 and the fourth semiconductor chip 400 due to the second dummy pattern 222.

Figure 12:
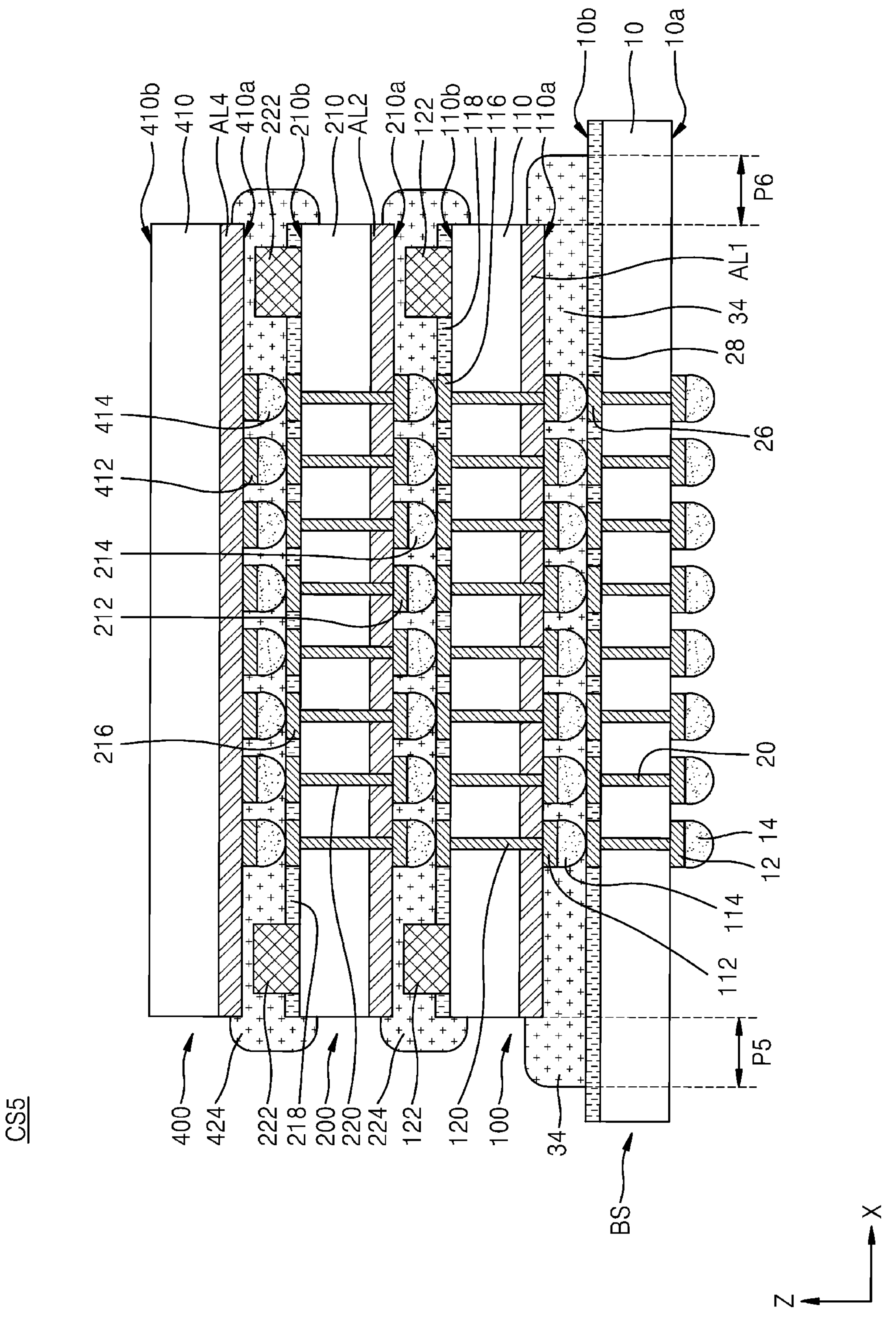
FIG. 12 is a cross-sectional view of a semiconductor device including semiconductor chips according to an embodiment of the inventive concept.

FIG. 12 is a cross-sectional view of a semiconductor device including semiconductor chips according to an embodiment of the inventive concept.

Specifically, when compared to the semiconductor device CS4 of FIG. 11, the semiconductor device CS5 may be the same except that the first semiconductor chip 100 is mounted on the base chip BS. In FIG. 12, the same descriptions as those given with reference to FIGS. 8 and 11 are briefly given or omitted.

The semiconductor device CS5 may include a base chip BS, a first semiconductor chip 100 mounted on the base chip BS, and a base adhesive layer 34 disposed between the base chip BS and the first semiconductor chip 100.

The semiconductor device CS5 may include a second semiconductor chip 200 mounted on the first semiconductor chip 100, a fourth semiconductor chip 400 mounted on the second semiconductor chip 200, a first adhesive layer 224 disposed between the first semiconductor chip 100 and the second semiconductor chip 200, and a third adhesive layer 424 disposed between the second semiconductor chip 200 and the fourth semiconductor chip 400. Since the first semiconductor chip 100, the second semiconductor chip 200, the first adhesive layer 224, and the third adhesive layer 424 have been described above, the descriptions thereof are omitted.

The base chip BS may include a base substrate 10 having a base lower surface 10*a* and a base upper surface 10*b* opposite to the base lower surface 10*a*. An external connection pad 12 may be disposed on the base lower surface 10*a*, and an external connection member 14 connected to the external connection pad 12 may be installed on the external connection pad 12.

Internal connection pads 26 may be disposed on the base upper surface 10*b*. The internal connection pad 26 may be insulated from a plurality of elements by the base passivation layer 28. The internal connection pad 26 may be connected to the first connection member 114. A base through electrode 20 connecting the internal connection pad 26 to the external connection pad 12 may be positioned in the base substrate 10.

The base adhesive layer 34 may be configured to surround the first chip connection pad 112 and the first connection member 114. The base adhesive layer 34 may adhere between the base chip BS and the first semiconductor chip 100.

The base adhesive layer 34 may protrude from one end and an opposite end of the first semiconductor chip 100 to a fifth protrusion length P5 and a second protrusion length P6, respectively. In some embodiments, the fifth protrusion length P5 and the second protrusion length P6 may be the same as or different from each other.

Figure 13:
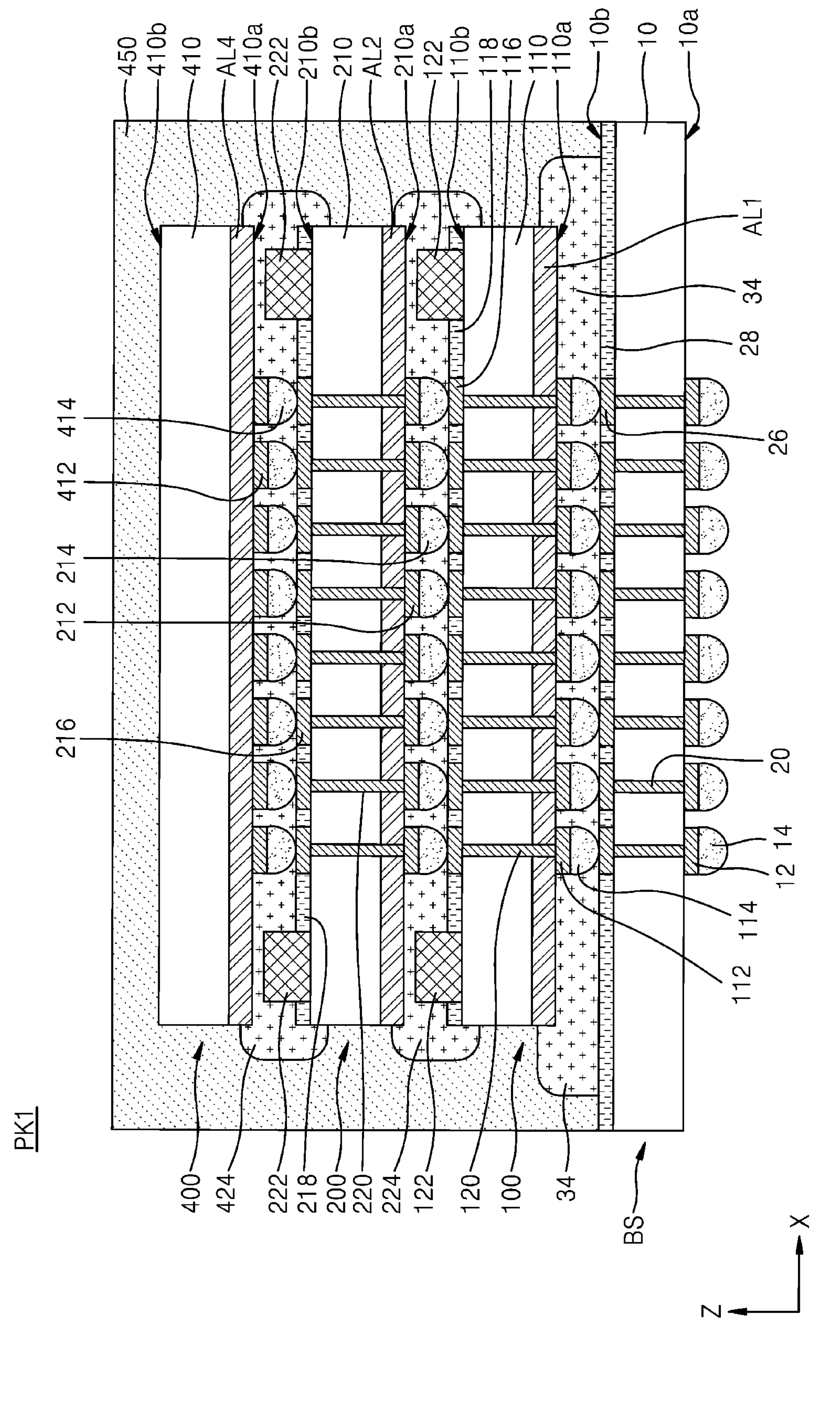
FIG. 13 is a cross-sectional view of a semiconductor package including semiconductor chips according to an embodiment of the inventive concept.

FIG. 13 is a cross-sectional view of a semiconductor package including semiconductor chips according to an embodiment of the inventive concept.

In detail, a semiconductor package PK1 may include an encapsulation layer 450 molding the semiconductor device CS5 shown in FIG. 12. The semiconductor package PK1 may include a base chip BS, a first semiconductor chip 100 mounted on the base chip BS, and a base adhesive layer 34 disposed between the base chip BS and the first semiconductor chip 100.

The semiconductor package PK1 may include a second semiconductor chip 200 mounted on the first semiconductor chip 100, a fourth semiconductor chip 400 mounted on the second semiconductor chip 200, a first adhesive layer 224 disposed between the first semiconductor chip 100 and the second semiconductor chip 200, and a third adhesive layer 424 disposed between the second semiconductor chip 200 and the fourth semiconductor chip 400.

The semiconductor package PK1 may include a base chip BS, a first semiconductor chip 100 mounted on the base chip BS, and a base adhesive layer 34 disposed between the base chip BS and the first semiconductor chip 100. Since the base chip BS, the base adhesive layer 34, the first semiconductor chip 100, the second semiconductor chip 200, the fourth semiconductor chip 400, the first adhesive layer 224, and the third adhesive layer 424 are described above, the descriptions thereof are omitted.

The semiconductor package PK1 may include a first semiconductor chip 100, a second semiconductor chip 200, a fourth semiconductor chip 400 on the base chip BS, an encapsulation layer 450 surrounding the base adhesive layer 34, a first adhesive layer 224, and a third adhesive layer 424. The encapsulation layer 450 may be formed of, for example, Epoxy Molding Compound (EMC).

Figure 14:
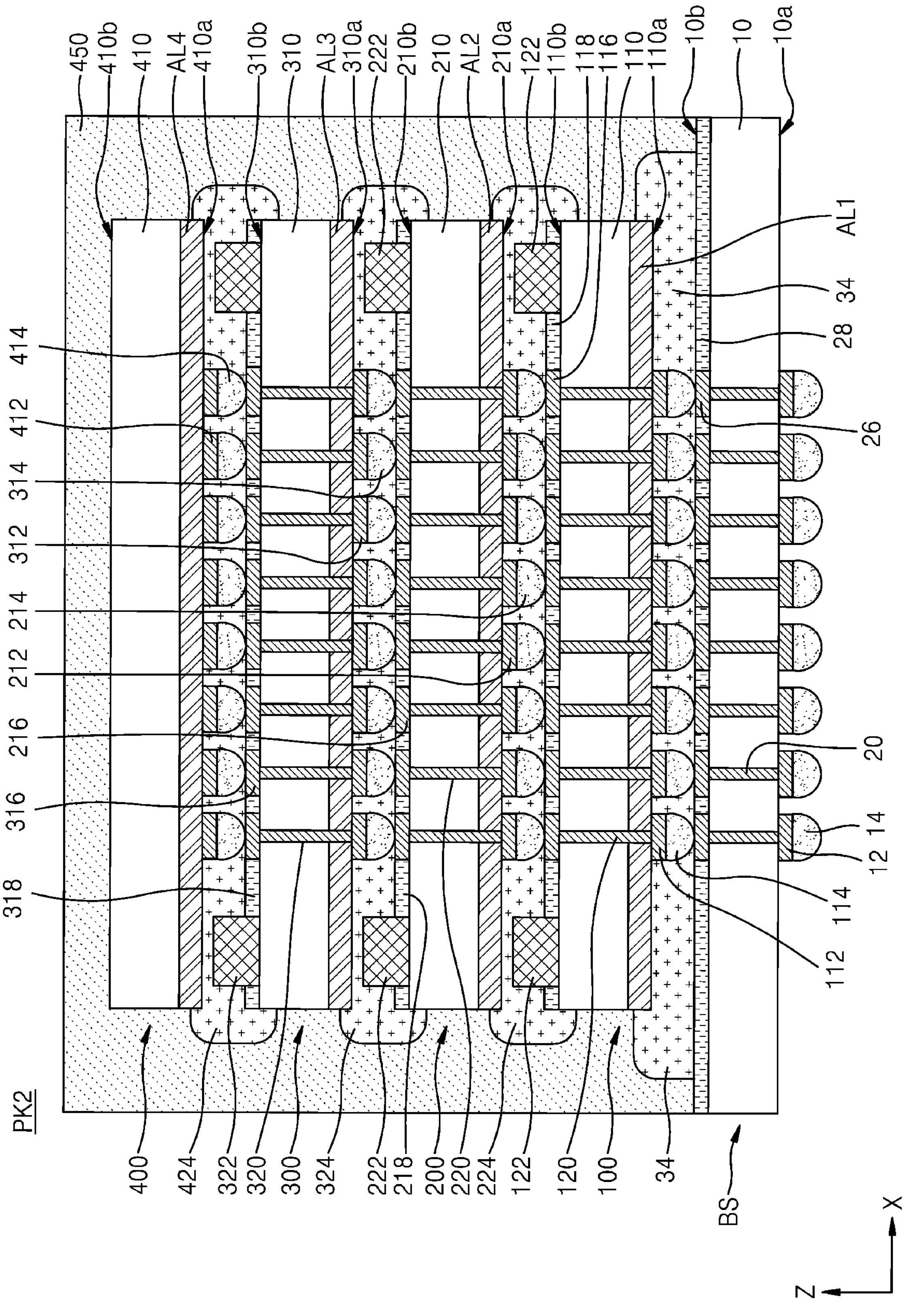
FIG. 14 is a cross-sectional view of a semiconductor package including semiconductor chips according to an embodiment of the inventive concept.

FIG. 14 is a cross-sectional view of a semiconductor package including semiconductor chips according to an embodiment of the inventive concept.

Specifically, when compared to the semiconductor package PK1 of FIG. 13, the semiconductor package PK2 may be the same except that the third semiconductor chip 300 is further stacked on the second semiconductor chip 200. In FIG. 14, the descriptions given above with reference to FIG. 13 are briefly given or omitted.

In the semiconductor package PK2, the first semiconductor chip 100, the second semiconductor chip 200, the third semiconductor chip 300, and the fourth semiconductor chip 400 may be sequentially mounted on the base chip BS. In FIG. 14, four semiconductor chips are stacked, but more semiconductor chips may be stacked.

The semiconductor package PK2 may include a base adhesive layer 34 disposed between the base chip BS and the first semiconductor chip 100, a first adhesive layer 224 disposed between the first semiconductor chip 100 and the second semiconductor chip 200, a second adhesive layer 324 disposed between the second semiconductor chip 200 and the third semiconductor chip 300, and a third adhesive layer 424 disposed between the third semiconductor chip 300 and the fourth semiconductor chip 400.

The semiconductor package PK2 may include an encapsulation layer 450 surrounding the first semiconductor chip 100, the second semiconductor chip 200, the third semiconductor chip 300, the fourth semiconductor chip 400, the base adhesive layer 34, the first adhesive layer 224, the second adhesive layer 324, and the third adhesive layer 424 on the base chip BS. Since the base chip BS, the base adhesive layer 34, the first semiconductor chip 100, the second semiconductor chip 200, the fourth semiconductor chip 400, the first adhesive layer 224, and the third adhesive layer 424 have been described previously, the descriptions thereof are omitted here.

The third semiconductor chip 300 has a fifth surface 310*a* and a sixth surface 310*b* opposite to the fifth surface 310*a*, and may include a third semiconductor substrate 310 having a third active layer AL3 adjacent to the fifth surface 310*a*, and a third through electrode 320 penetrating at least a portion of the third semiconductor substrate 310 and connected to the third active layer AL3. The third semiconductor substrate 310 and the third through electrode 320 may have structures corresponding to the first semiconductor substrate 110 and the first through electrode 120, respectively.

The third semiconductor chip 300 may include a sixth chip connection pad 316 on the sixth surface 310*b* of the third semiconductor substrate 310 to be connected to the third through electrode 320, and a third dummy pattern 322 positioned outside the sixth chip connection pads 316 in a plan view on the third surface 310*b* of the third semiconductor substrate 310. The third dummy pattern 322 and the sixth chip connection pad 316 may be insulated from a plurality of elements by the third passivation layer 318.

The third semiconductor chip 300 may include a fifth chip connection pad 312 on the fifth surface 310*a* of the third semiconductor substrate 310 to be connected to the third through electrode 320, and a third connection member 314 attached to the fifth chip connection pad 312 and connecting the fifth chip connection pad 312 to the fourth chip connection pad 216.

The second adhesive layer 324 may be configured to surround the fourth chip connection pad 216, the fifth chip connection pad 312, the third connection member 314, and the second dummy pattern 222. The second adhesive layer 324 may contact adjacent facing surfaces of the second semiconductor substrate 210 and the third semiconductor substrate 310, and side surfaces of the second semiconductor substrate 210 and the third semiconductor substrate 310. The second adhesive layer 324 may easily adhere the second semiconductor chip 200 and the third semiconductor chip 300 due to the second dummy pattern 222.

FIGS. 15A to 15E are cross-sectional views illustrating a method of manufacturing a semiconductor package including semiconductor chips according to an embodiment of the inventive concept.

Specifically, FIGS. 15A to 15E are provided to explain a method of manufacturing the semiconductor package PK2 of FIG. 14. In FIGS. 15A to 15E, in the descriptions given above with reference to FIG. 14 are briefly given or omitted.

Figure 15A:
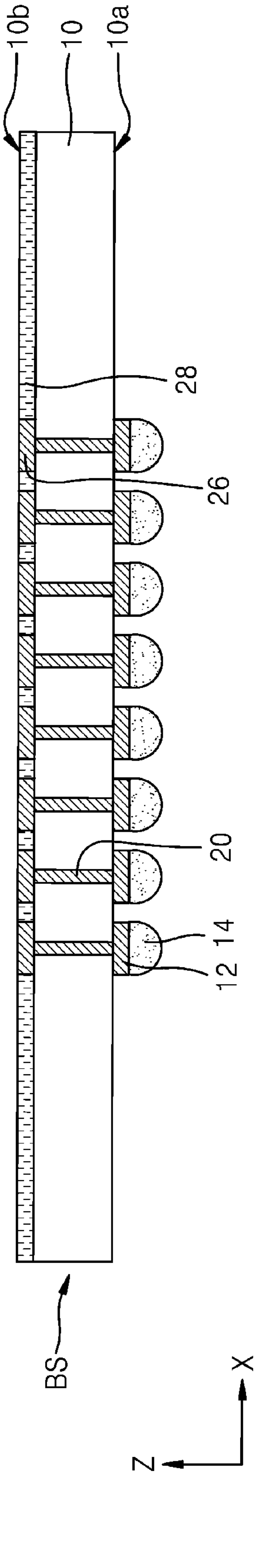
FIGS. 15A to 15E are cross-sectional views illustrating a method of manufacturing a semiconductor package including semiconductor chips according to an embodiment of the inventive concept.

Referring to FIG. 15A, a base chip BS is prepared. The base chip BS may include a base substrate 10 having a base lower surface 10*a* and a base upper surface 10*b* opposite to the base lower surface 10*a*. An external connection pad 12 may be disposed on the base lower surface 10*a*, and an external connection member 14 connected to the external connection pad 12 may be installed on the external connection pad 12. An internal connection pad 26 may be disposed on the base upper surface 10*b*. The internal connection pad 26 may be insulated by the base passivation layer 28. A base through electrode 20 connecting the internal connection pad 26 to the external connection pad 12 may be positioned in the base substrate 10.

Figure 15B:
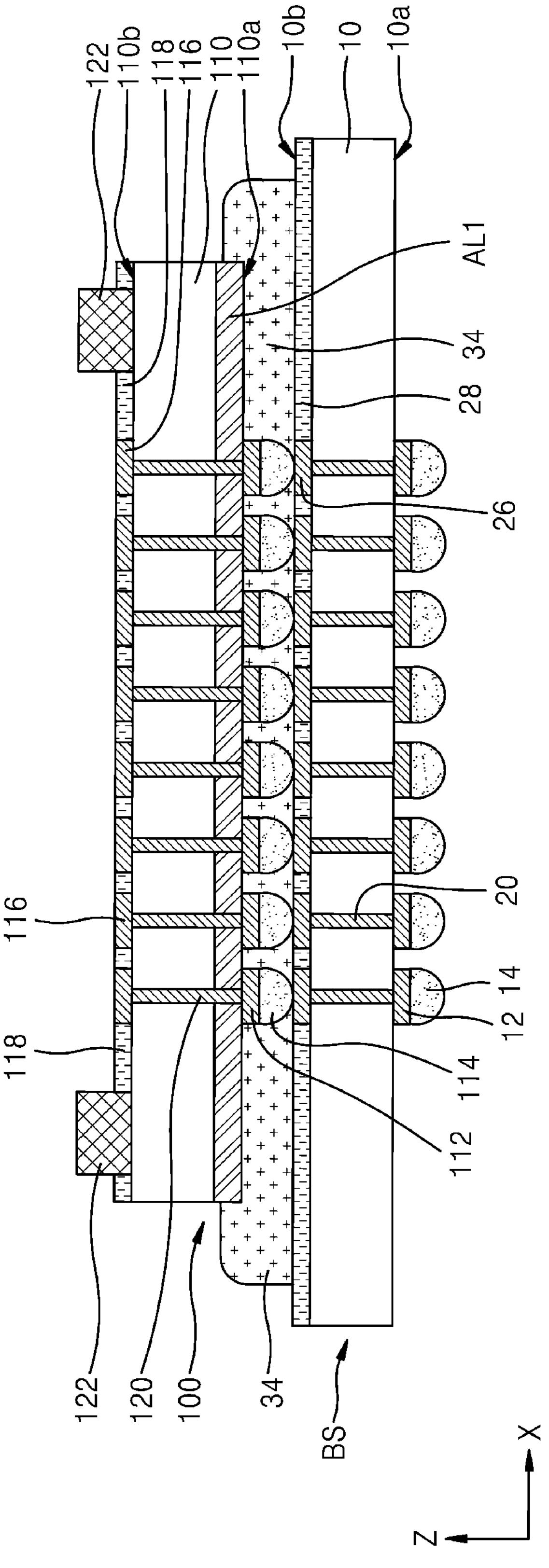

Referring to FIG. 15B, the first semiconductor chip 100 is attached to the base chip BS by using the base adhesive layer 34. The first semiconductor chip 100 is attached to the base upper surface 10*b* of the base chip BS with the base adhesive layer 34 therebetween.

The first semiconductor chip 100 may include a first semiconductor substrate 110, a first chip connection pad 112, a first connection member 114, a second chip connection pad 116, a first through electrode 120, and a first dummy pattern 122.

Figure 15C:
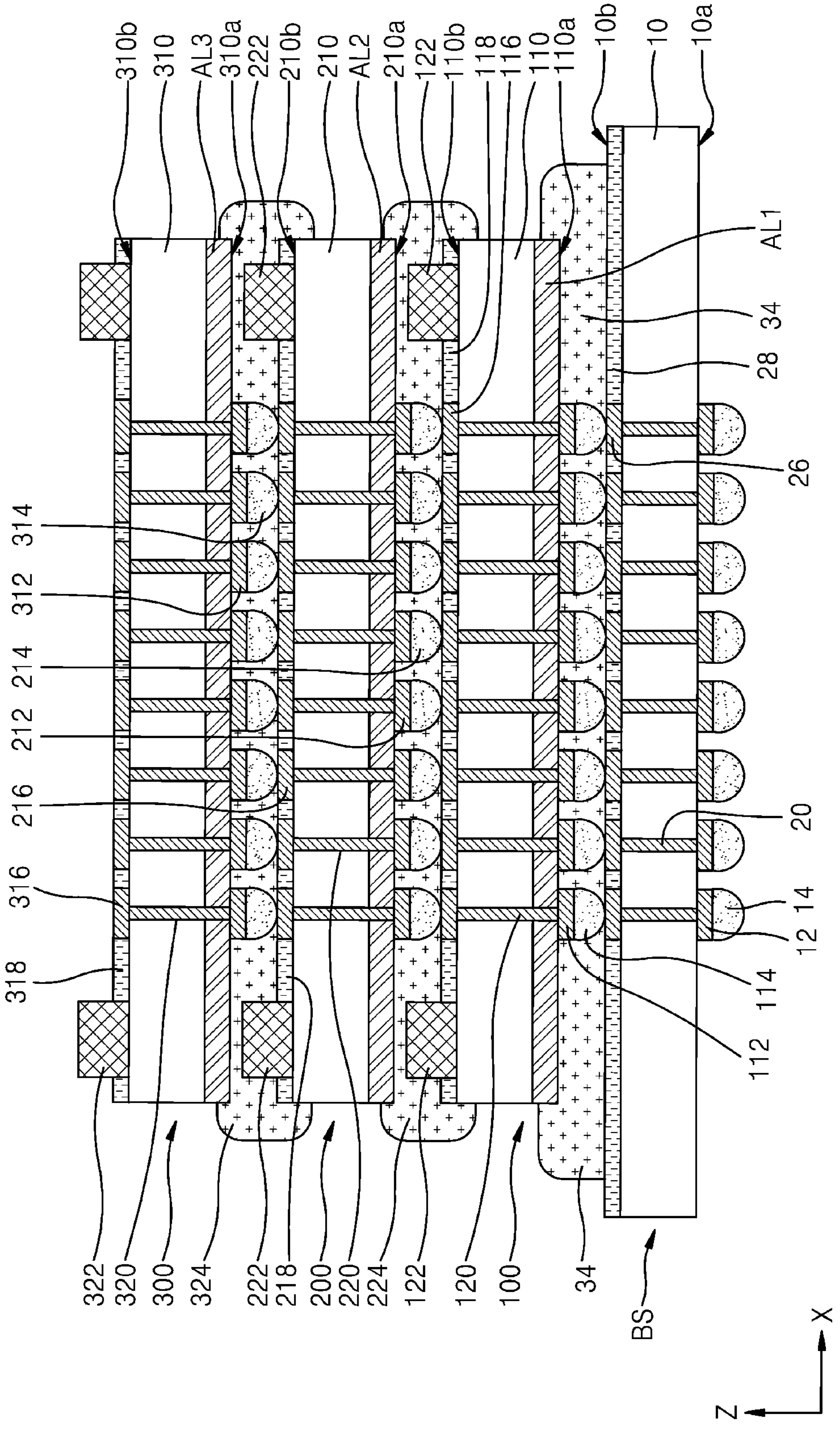

Referring to FIG. 15C, the second semiconductor chip 200 is attached to the first semiconductor chip 100 with the first adhesive layer 224 therebetween. The second semiconductor chip 200 may include a second semiconductor substrate 210, a third chip connection pad 212, a second connection member 214, a fourth chip connection pad 216, a second through electrode 220, and a second dummy pattern 222. The second semiconductor chip 200 may be easily attached to the first semiconductor chip 100 due to the formation of the first dummy pattern 122. For example, due to heating, the first adhesive layer 224 may expand and conform to the shape of the third chip connection pads 212, second connection members 214, and the second dummy patterns 222. In particular, the second dummy patterns 222 may serve as a fastener, rivet, or other physical connector to better adhere adjacent chips to each other due to a greater surface area of connection within the adhesive layer. At the same time, the second dummy patterns 222 may control the flow of the first adhesive layer 224 to limit its expansion beyond the side surfaces of the first and second semiconductor chips 100 and 200.

Subsequently, the third semiconductor chip 300 is attached to the second semiconductor chip 200 with the second adhesive layer 324 therebetween. The third semiconductor chip 300 may include a third semiconductor substrate 310, a fifth chip connection pad 312, a third connection member 314, a sixth chip connection pad 316, a third through electrode 320, and a third dummy pattern 322. The third semiconductor chip 300 may be easily attached on the second semiconductor chip 200 due to the second dummy pattern 222.

Figure 15D:
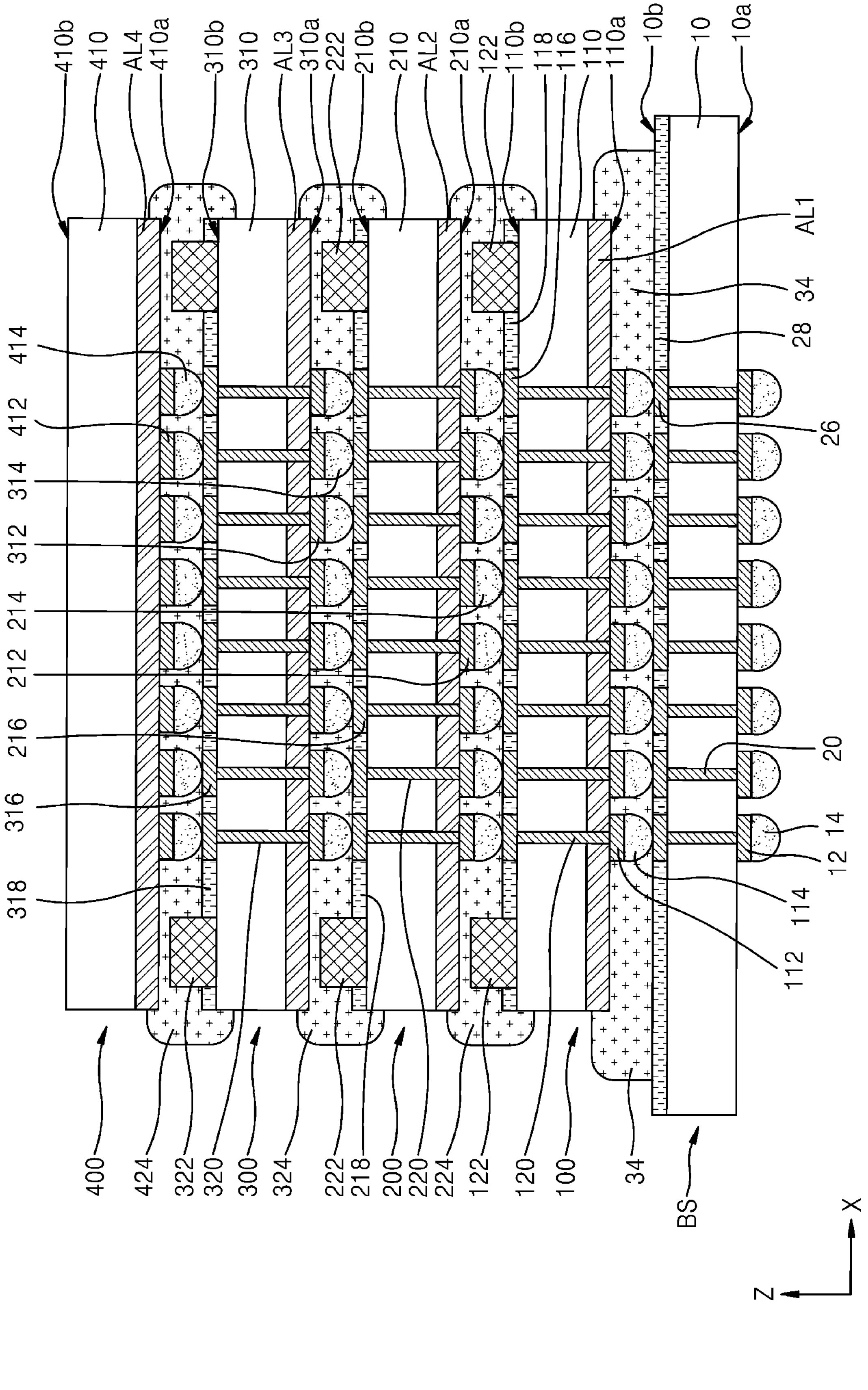

Referring to FIG. 15D, the fourth semiconductor chip 400 is attached to the third semiconductor chip 300 with the third adhesive layer 424 therebetween. The fourth semiconductor chip 400 may include a fourth semiconductor substrate 410, a seventh chip connection pad 412, and a fourth connection member 414. The fourth semiconductor chip 400 may be easily attached on the third semiconductor chip 300 due to the third dummy pattern 322.

Figure 15E:
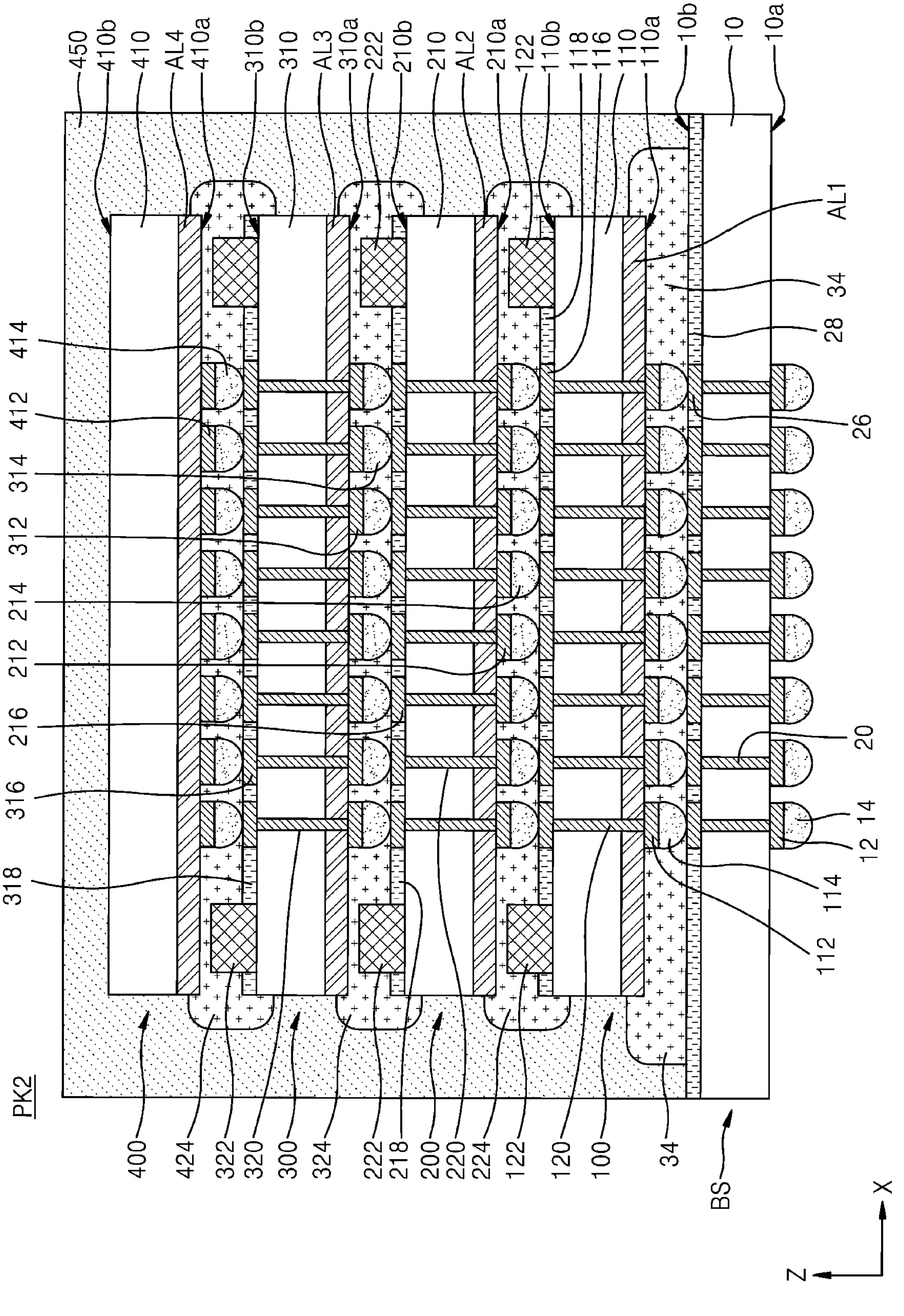

Referring to FIG. 15E, an encapsulation layer 450 surrounding the first semiconductor chip 100, the second semiconductor chip 200, the third semiconductor chip 300, the fourth semiconductor chip 400, the base adhesive layer 34, the first adhesive layer 224, the second adhesive layer 324, and the third adhesive layer 424 is formed on the base chip BS. A semiconductor package may be completed through such a process. In some embodiments, due to the use of the dummy patterns, which may function as dams to suppress the expansion of the adhesive layers toward side surfaces of the semiconductor chips, the adhesive layers may not expand as far toward the side surfaces, and may still expand a small amount more toward the corners of the semiconductor chips where the dummy patterns are not located. Also, because the dummy patterns may be formed in the shape of a bar or line, having an exposed surface area on side surfaces and a top surface, as mentioned above, the use of the dummy patterns may add to the connection surface area of the adhesive layer, which increases the amount of adhesion between the two adjacent semiconductor chips.

Figure 16:
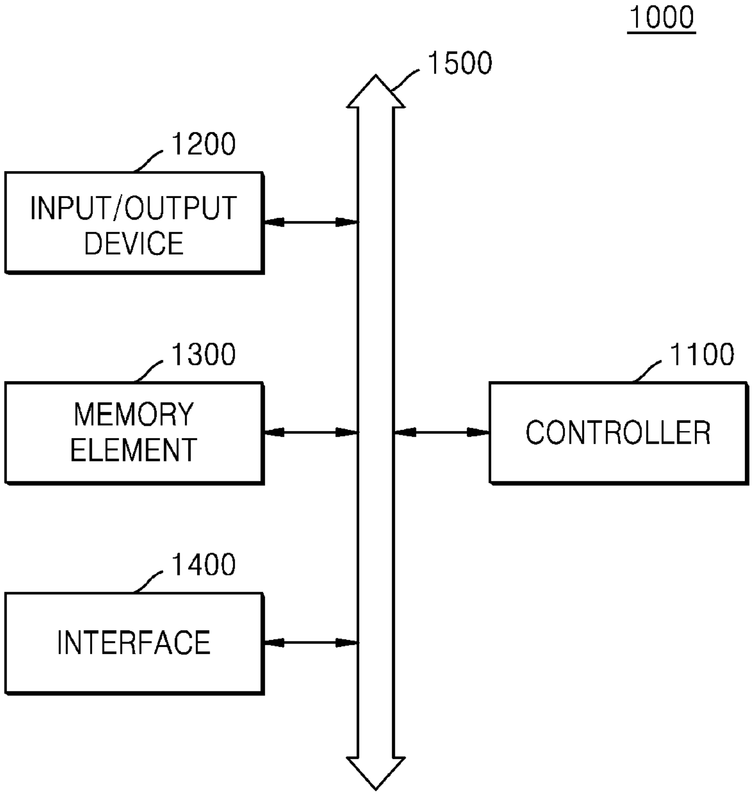
FIG. 16 is a schematic block diagram illustrating an example of a memory system having a semiconductor package according to an embodiment of the inventive concept.

FIG. 16 is a schematic block diagram illustrating an example of a memory system having a semiconductor package according to an embodiment of the inventive concept.

Specifically, a memory system 1000 may be applied to Personal Digital Assistants (PDAs), portable computers, web tablets, wireless phones, mobile phones, digital music players, memory cards, or any device capable of transmitting and/or receiving information in a wireless environment.

The memory system 1000 includes a controller 1100, an input/output (I/O) device 1200 such as a keypad, a keyboard, and a display, a memory element 1300 (or memory chip), an interface 1400, and a bus 1500. The memory element 1300 and the interface 1400 communicate with each other through the bus 1500.

The controller 1100 includes at least one of a microprocessor, a digital signal processor, a microcontroller, or another similar process device. The memory element 1300 may be used to store commands executed by the controller 1100. The input/output device 1200 may receive data or signals from the outside of the memory system 1000 or output data or signals to the outside of the memory system 1000. For example, the input/output device 1200 may include a keyboard, keypad, or display device.

The memory element 1300 and the controller 1100 may include semiconductor packages PK1 and PK2 according to an embodiment of the inventive concept. The memory element 1300 may further include other types of memory, volatile memory that may be accessed at any time, and other various types of memory. The interface 1400 transmits data to a communication network or receives data from the communication network.

Figure 17:
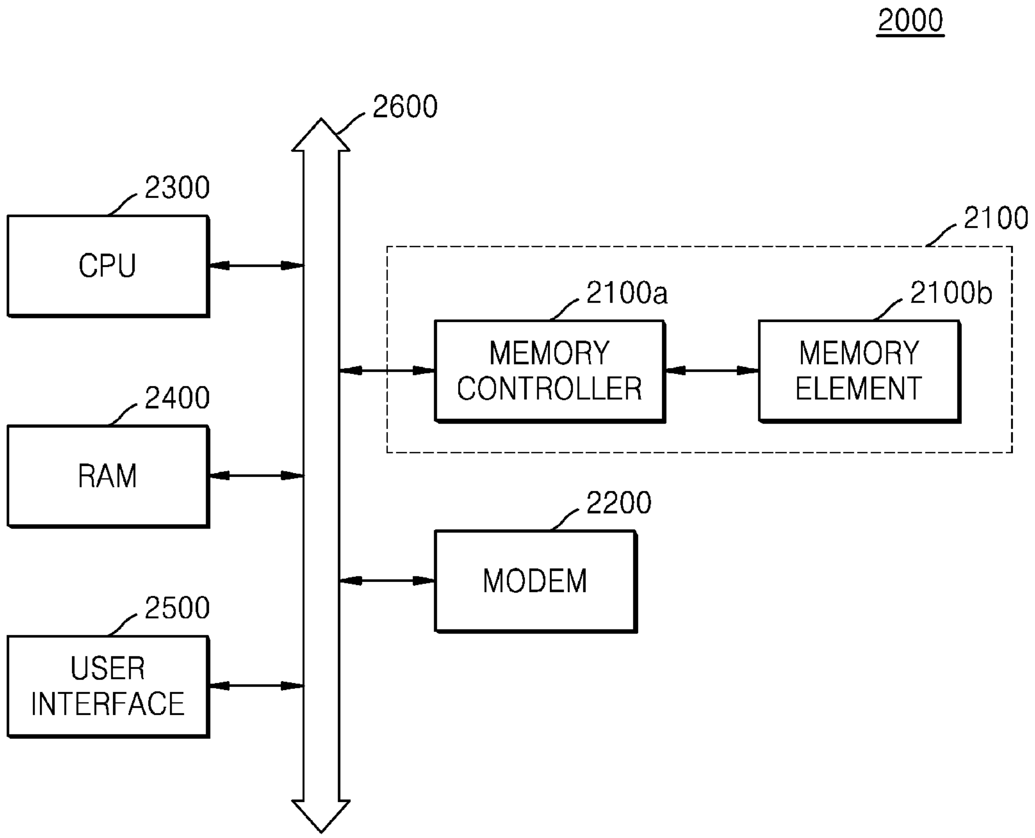
FIG. 17 is a schematic block diagram illustrating an example of an information processing system having a semiconductor package according to an embodiment of the inventive concept.

FIG. 17 is a schematic block diagram illustrating an example of an information processing system having a semiconductor package according to an embodiment of the inventive concept.

Specifically, an information processing system 2000 may be used for a mobile device or a desktop computer. The information processing system 2000 may include a memory system 2100 including a memory controller 2100*a* and a memory element 2100*b*.

The information processing system 2000 includes a MOdulator and DEModulator (MODEM) 2200, a central processing unit 2300, RAM 2400, and a user interface 2500 electrically connected to a system bus 2600. Data processed by the CPU 2300 or data input from the outside are stored in the memory system 2100.

The memory system 2100 having a memory controller 2100*a* and a memory element 2100*b*, the MODEM 2200, the central processing unit 2300, and the RAM 2400 may include the semiconductor packages PK1 and PK2 according to the embodiment.

The memory system 2100 may include a solid state drive, and in this case, the information processing system 2000 may stably store large amounts of data in the memory system 2100. In addition, as reliability increases, the memory system 2100 may save resources required for error correction and thus provide a high-speed data exchange function to the information processing system 2000.

Although not shown, the information processing system 2000 may further include an application chipset, a camera image signal processor (ISP), an input/output device, and the like.

While the inventive concept has been particularly shown and described with reference to embodiments thereof, it will be understood that various changes in form and details may be made therein without departing from the spirit and scope of the following claims.

What is claimed is:

1. A semiconductor device comprising:

a first semiconductor chip, the first semiconductor chip comprising:

a first semiconductor substrate having a first surface and a second surface opposite to the first surface, and having a first active layer adjacent to the first surface, the first semiconductor substrate having a quadrangle shape from a plan view;

a first through electrode penetrating at least a portion of the first semiconductor substrate and connected to the first active layer;

a second chip connection pad on the second surface of the first semiconductor substrate and connected to the first through electrode;

a first dummy pattern positioned outside the second chip connection pad on the second surface of the first semiconductor substrate from the plan view, the first dummy pattern comprising a dam structure including a line pattern extending lengthwise horizontally along the second surface of the first semiconductor substrate; and a first chip connection pad on the first surface of the first semiconductor substrate and connected to the first through electrode, wherein the first dummy pattern is disposed adjacent to at least one side of four sides of the quadrangle shape of the first semiconductor substrate from the plan view.

2. The semiconductor device of claim 1, wherein the first dummy pattern comprises a plurality of dummy patterns disposed on the same plane, and the plurality of dummy patterns comprise a plurality of line patterns disposed adjacent to the four sides of the quadrangle shape of the first semiconductor substrate from the plan view and spaced apart from each other.

3. A semiconductor device comprising:

a first semiconductor chip, the first semiconductor chip comprising:

a first semiconductor substrate having a first surface and a second surface opposite to the first surface, and having a first active layer adjacent to the first surface, the first semiconductor substrate having a quadrangle shape from a plan view;

a first through electrode penetrating at least a portion of the first semiconductor substrate and connected to the first active layer:

a second chip connection pad on the second surface of the first semiconductor substrate and connected to the first through electrode;

a first dummy pattern positioned outside the second chip connection pad on the second surface of the first semiconductor substrate from the plan view, the first dummy pattern comprising a line pattern extending horizontally along the second surface of the first semiconductor substrate:

a first chip connection pad on the first surface of the first semiconductor substrate and connected to the first through electrode, a second semiconductor chip mounted on the first semiconductor chip; and a first adhesive layer disposed between the first semiconductor chip and the second semiconductor chip, wherein the first dummy pattern is disposed adjacent to at least one side of four sides of the quadrangle shape of the first semiconductor substrate from the plan view, wherein the second semiconductor chip comprises: a second semiconductor substrate having a third surface and a fourth surface opposite to the third surface, and having a second active layer adjacent to the third surface, the second semiconductor substrate having a quadrangle shape from a plan view; a second through electrode penetrating at least a portion of the second semiconductor substrate and connected to the second active layer; a fourth chip connection pad on the fourth surface of the second semiconductor substrate and connected to the second through electrode; a second dummy pattern positioned outside the fourth chip connection pad on the fourth surface of the second semiconductor substrate from the plan view, the second dummy pattern comprising a line pattern extending horizontally along the fourth surface of the second semiconductor substrate; a third chip connection pad on the third surface of the second semiconductor substrate and connected to the second through electrode; and a first connection terminal attached to the third chip connection pad to connect the third chip connection pad to the second chip connection pad, wherein the second dummy pattern is disposed adjacent to at least one side of four sides of the quadrangle shape of the second semiconductor substrate from the plan view, and wherein the first adhesive layer surrounds the second chip connection pad, the third chip connection pad, the first connection terminal, and the first dummy pattern.

4. The semiconductor device of claim 3, wherein the first dummy pattern comprises a plurality of first dummy patterns disposed on a first plane, and the plurality of first dummy patterns comprise a plurality of first line patterns arranged adjacent to and spaced apart from the four sides of the quadrangle shape of the first semiconductor substrate from the plan view, and wherein the second dummy pattern comprises a plurality of second dummy patterns disposed on a second plane, and the plurality of second dummy patterns comprise a plurality of second line patterns disposed adjacent to and spaced apart from the four sides of the quadrangle shape of the second semiconductor substrate from the plan view.

5. The semiconductor device of claim 3, wherein a height of the first dummy pattern above the second surface of the first semiconductor substrate is greater than a height of the second chip connection pad above the second surface of the first semiconductor substrate, and a height of the second dummy pattern above the fourth surface of the second semiconductor substrate is greater than a height of the fourth chip connection pad above the fourth surface of the second semiconductor substrate.

6. The semiconductor device of claim 3, wherein the first dummy pattern has an integral structure with the first semiconductor substrate, and the second dummy pattern has an integral structure with the second semiconductor substrate.

7. The semiconductor device of claim 3, wherein the first adhesive layer protrudes from opposite side surfaces of each of the first semiconductor substrate and the second semiconductor substrate.

8. The semiconductor device of claim 3, wherein the first adhesive layer contacts withopposite side surfaces of each of the first semiconductor substrate and the second semiconductor substrate.

9. The semiconductor device of claim 3, wherein the first dummy pattern contacts both the second surface of the first semiconductor substrate and the third surface of the second semiconductor substrate.

10. The semiconductor device of claim 3, further comprising:

a base chip, the first semiconductor chip being mounted on the base chip;

a base adhesive layer disposed between the base chip and the first semiconductor chip; and an encapsulation layer surrounding the first semiconductor chip, the second semiconductor chip, the base adhesive layer, and the first adhesive layer on the base chip;

wherein the base chip comprises: a base substrate having a base lower surface and a base upper surface opposite the base lower surface; an external connection pad disposed on the base lower surface; an external connection terminal connected to the external connection pad; and an internal connection pad disposed on the base upper surface of the base substrate, wherein the first semiconductor chip comprises: a second connection terminal connected to the first chip connection pad and the internal connection pad, wherein the base adhesive layer surrounds the first chip connection pad and the second connection terminal, and wherein the semiconductor device is a semiconductor package.

11. The semiconductor device of claim 10, wherein the first dummy pattern comprises a plurality of first dummy patterns disposed on a first plane, and the plurality of first dummy patterns comprise a plurality of first line patterns arranged adjacent to and spaced apart from the four sides of the quadrangle shape of the first semiconductor substrate from the plan view, and wherein the second dummy pattern comprises a plurality of second dummy patterns disposed on a second plane, and the plurality of second dummy patterns comprise a plurality of second line patterns disposed adjacent to and spaced apart from the four sides of the quadrangle shape of the second semiconductor substrate from the plan view.

12. The semiconductor device of claim 10, wherein the first adhesive layer contacts opposite side surfaces of the first semiconductor substrate and the second semiconductor substrate, and the first adhesive layer is not exposed to the outside of the semiconductor package by the encapsulation layer.

13. The semiconductor device of claim 10, wherein a third semiconductor chip is further disposed on the second semiconductor chip with a second adhesive layer therebetween, and the encapsulation layer surrounds the first semiconductor chip, the second semiconductor chip, the third semiconductor chip, the base adhesive layer, and the first adhesive layer.

14. A semiconductor device comprising:

a first semiconductor chip, the first semiconductor chip comprising:

a first semiconductor substrate having a first surface and a second surface opposite to the first surface, and having a first active layer adjacent to the first surface, the first semiconductor substrate having a quadrangle shape from a plan view;

a plurality of first through electrodes penetrating at least a portion of the first semiconductor substrate and connected to the first active layer;

a plurality of second chip connection pads on the second surface of the first semiconductor substrate and respectively connected to the plurality of first through electrodes;

a plurality of protruding line patterns positioned outside the plurality of second chip connection pads on the second surface of the first semiconductor substrate from the plan view, each line pattern of the plurality of protruding line patterns contacting and extending horizontally along the second surface of the first semiconductor substrate; and a plurality of first chip connection pads on the first surface of the first semiconductor substrate and respectively connected to the plurality of first through electrodes, wherein the plurality of protruding line patterns are disposed adjacent to respective sides of the quadrangle shape of the first semiconductor substrate from the plan view.

15. The semiconductor device of claim 14, wherein each protruding line pattern of the plurality of protruding line patterns has a bar shape extending adjacent to a respective side of the quadrangle shape along only a portion of the respective side.

16. The semiconductor device of claim 15, wherein the plurality of protruding line patterns are formed of the same material as the first semiconductor substrate or of a different, insulating material.

17. The semiconductor device of claim 14, further comprising:

a second semiconductor chip disposed on the second surface of the first semiconductor chip; and an adhesive layer formed between the second semiconductor chip and the second surface of the first semiconductor chip;

wherein the adhesive layer surrounds and contacts the plurality of protruding line patterns.

18. The semiconductor device of claim 17, wherein the adhesive layer extends horizontally beyond side surfaces of the first semiconductor chip and the second semiconductor chip.

19. The semiconductor device of claim 18, further comprising:

an encapsulation layer formed to surround the side surfaces of the first and second semiconductor chips and side surfaces of the adhesive layer.

20. The semiconductor device of claim 17, wherein the plurality of protruding line patterns are dam structures that control the flow of an adhesive material that forms the adhesive layer.

* * * * *